(12) United States Patent
Pagani

(10) Patent No.: US 8,941,108 B2
(45) Date of Patent: Jan. 27, 2015

(54) METHOD TO PERFORM ELECTRICAL TESTING AND ASSEMBLY OF ELECTRONIC DEVICES

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

(*) Notice: Subject to any disclaimer, the term of this patent is extended or adjusted under 35 U.S.C. 154(b) by 14 days.

(21) Appl. No.: 13/722,684

(22) Filed: Dec. 20, 2012

(65) Prior Publication Data

US 2013/0109111 A1 May 2, 2013

Related U.S. Application Data

(62) Division of application No. 12/869,377, filed on Aug. 26, 2010, now Pat. No. 8,362,620.

(30) Foreign Application Priority Data

Aug. 28, 2009 (IT) .................................. MI09A1510

(51) Int. Cl.
  *H01L 23/58* (2006.01)
(52) U.S. Cl.
  USPC ............ 257/48; 257/E21.52; 438/17; 438/11; 438/13; 324/754.03; 324/762.01; 324/537; 324/76.11
(58) Field of Classification Search
  CPC .......................... G01R 31/2884; H05K 1/0268
  USPC .................... 324/754.03, 762.01, 537, 76.11; 257/48, E21.521; 438/17, 11, 113
  See application file for complete search history.

(56) References Cited

U.S. PATENT DOCUMENTS 5,059,899 A 10/1991 Farnworth et al.
5,366,906 A 11/1994 Wojnarowski et al.
(Continued)

FOREIGN PATENT DOCUMENTS

EP 0413542 A2 2/1991
EP 0913863 A2 5/1999
(Continued)

OTHER PUBLICATIONS

Sauter, W. et al., "Problems with Wirebonding on Probe Marks and Possible Solutions," Proceedings of the 53rd Electronic Components and Technology Conference, pp. 1350-1358, May 27-30, 2003.
(Continued)

*Primary Examiner* — Eva Yan Montalvo
(74) *Attorney, Agent, or Firm* — Seed IP Law Group PLLC

(57) ABSTRACT

A method performs electrical testing and assembly of an electronic device on a wafer and comprising a pad made in an oxide layer covered by a passivation layer. The method includes connecting the electronic device to a testing apparatus; providing said electronic device with a metallization layer extending on the passivation layer from the pad to a non-active area of said wafer. The method comprises-performing the electrical testing on wafer of the electronic device by placing a probe of on a portion of the extended metallization layer; performing the cut of said wafer, reducing the extension of the metallization layer to the edge of the electronic device; embedding the device inside a package, forming on the metallization layer an electrical connection configured to connect the metallization layer to a circuit in said package.

18 Claims, 37 Drawing Sheets

(56) References Cited

U.S. PATENT DOCUMENTS

| | | |
|---|---|---|
| 5,489,538 A | 2/1996 | Rostoker et al. |
| 5,532,174 A | 7/1996 | Corrigan |
| 5,654,588 A | 8/1997 | Dasse et al. |
| 5,696,404 A | 12/1997 | Murari et al. |
| 5,897,193 A | 4/1999 | Nishino |
| 5,923,047 A | 7/1999 | Chia et al. |
| 5,956,567 A | 9/1999 | Tomita |
| 5,969,538 A | 10/1999 | Whetsel |
| 6,341,070 B1 | 1/2002 | Yu |
| 6,730,989 B1 | 5/2004 | Reithinger et al. |
| 6,744,067 B1 | 6/2004 | Farnworth et al. |
| 6,806,494 B2 | 10/2004 | Fenner et al. |
| 6,806,556 B2 | 10/2004 | Ohara |
| 6,844,631 B2 | 1/2005 | Yong et al. |
| 6,861,761 B2 | 3/2005 | Yang et al. |
| 7,071,487 B2 | 7/2006 | Maruyama |
| 7,202,682 B2 | 4/2007 | Cooper et al. |
| 7,642,551 B2 | 1/2010 | Maruyama |
| 2002/0180026 A1* | 12/2002 | Liu et al. ............... 257/692 |
| 2003/0067001 A1 | 4/2003 | Poo et al. |
| 2003/0141529 A1 | 7/2003 | Seto et al. |
| 2005/0167831 A1 | 8/2005 | Tsubosaki |
| 2006/0163700 A1 | 7/2006 | Bae |
| 2006/0236172 A1 | 10/2006 | Okamoto |
| 2007/0200585 A1 | 8/2007 | Takeuchi et al. |
| 2007/0216438 A1 | 9/2007 | Gupta et al. |
| 2007/0275539 A1 | 11/2007 | Rashid et al. |
| 2008/0173999 A1 | 7/2008 | Chung et al. |
| 2008/0277705 A1 | 11/2008 | Takahashi et al. |
| 2009/0102065 A1 | 4/2009 | Lee |
| 2009/0212399 A1 | 8/2009 | Kaneda et al. |
| 2010/0007029 A1* | 1/2010 | Do et al. ............... 257/774 |
| 2011/0049728 A1 | 3/2011 | Pagani |

FOREIGN PATENT DOCUMENTS

| | | |
|---|---|---|
| JP | 2-144931 A | 6/1990 |
| JP | 2-211648 A | 8/1990 |
| JP | 6-151535 A | 5/1994 |
| JP | 7-297244 A | 11/1995 |
| JP | 2000-124278 A | 4/2000 |
| JP | 2004-342725 A | 12/2004 |
| WO | 2007/036867 A2 | 4/2007 |
| WO | 2010/015388 A1 | 2/2010 |

OTHER PUBLICATIONS

Ivy, W.L., Jr. et al., "Sacrificial Metal Wafer Level Burn-In KGD," Proceedings of the 50th Electronic Components and Technology Conference, pp. 535-540, 2000.

Yong, L. et al., "Novel Method of Separating Probe and Wire Bond Regions Without Increasing Die Size," Proceedings of the 53rd Electronic Components and Technology Conference, pp. 1323-1329, May 27-30, 2003.

Williams, B. et al., "A 44μm Probe Process Characterization and Factory Deployment Using Probe-Over Passivation," SWTW-2003, Motorola, Inc., 2002.

* cited by examiner

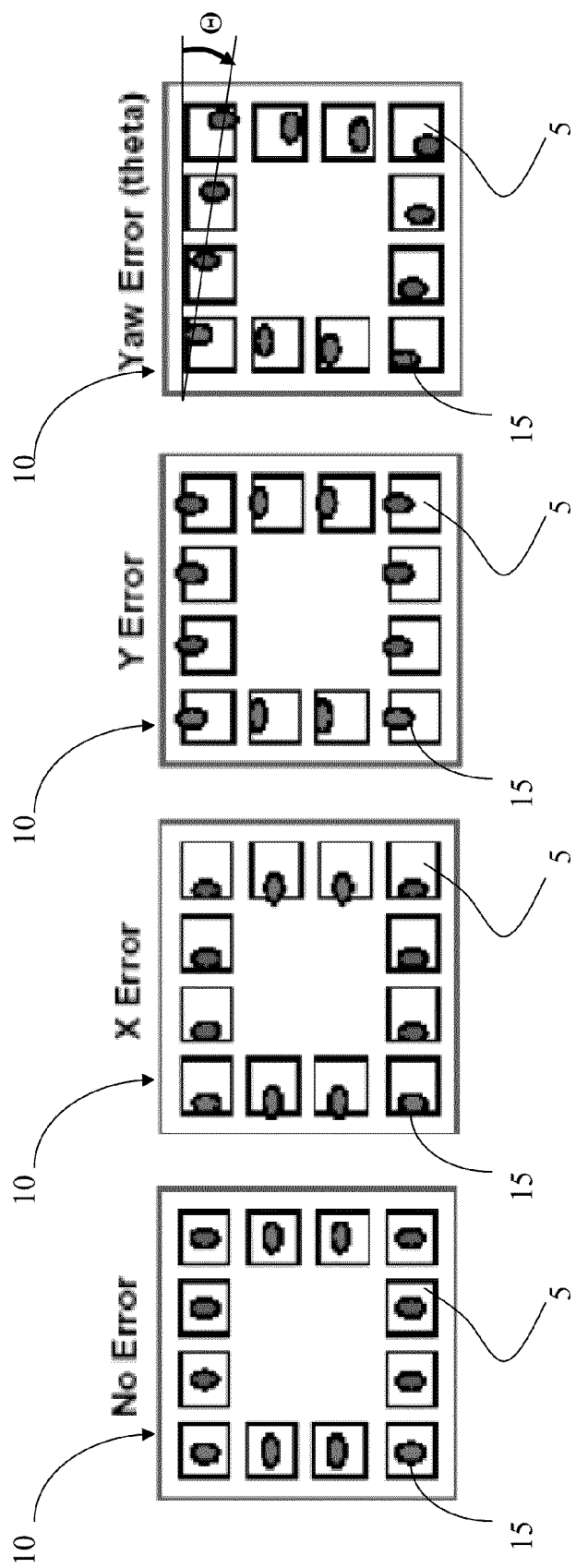

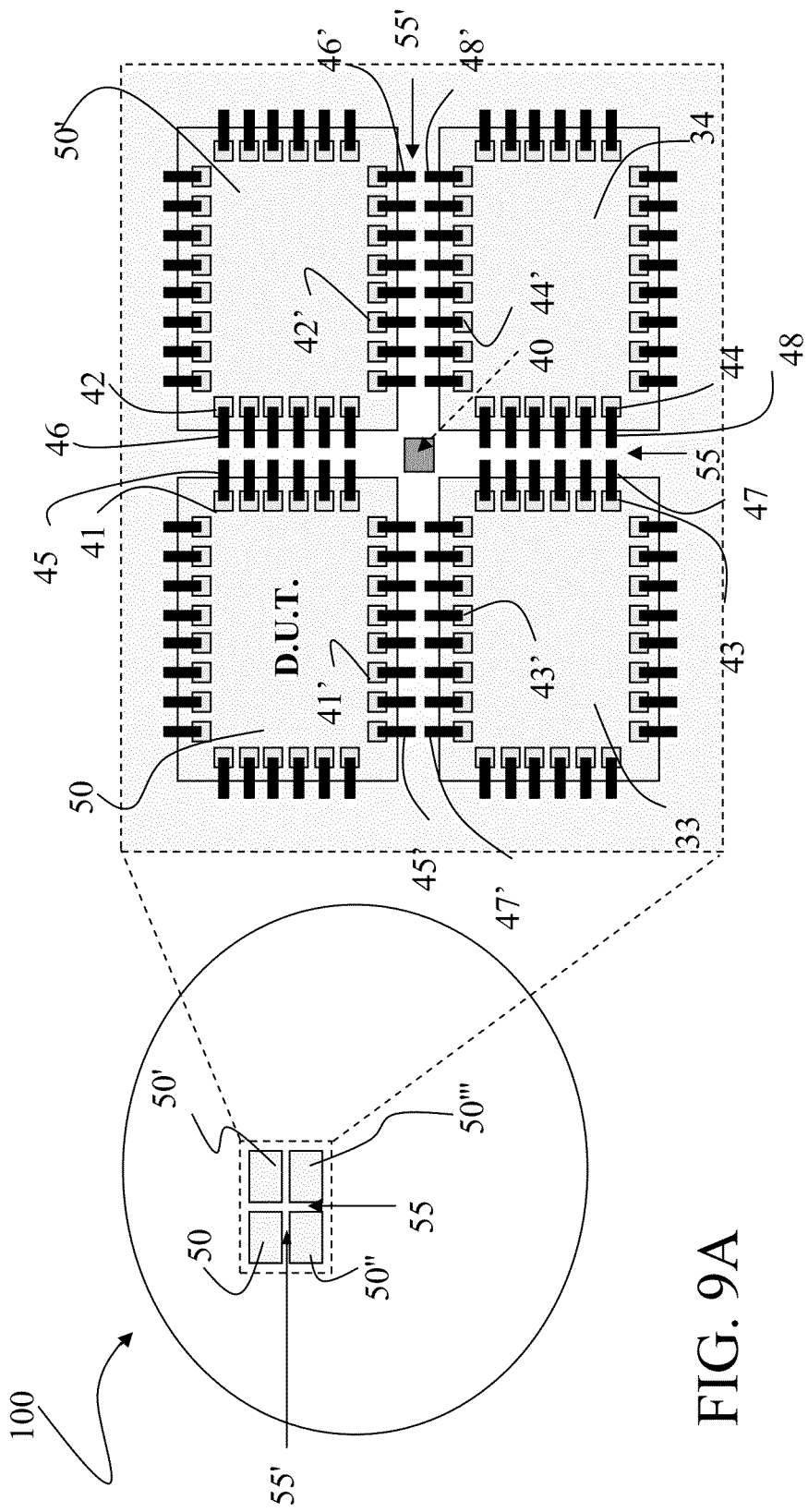

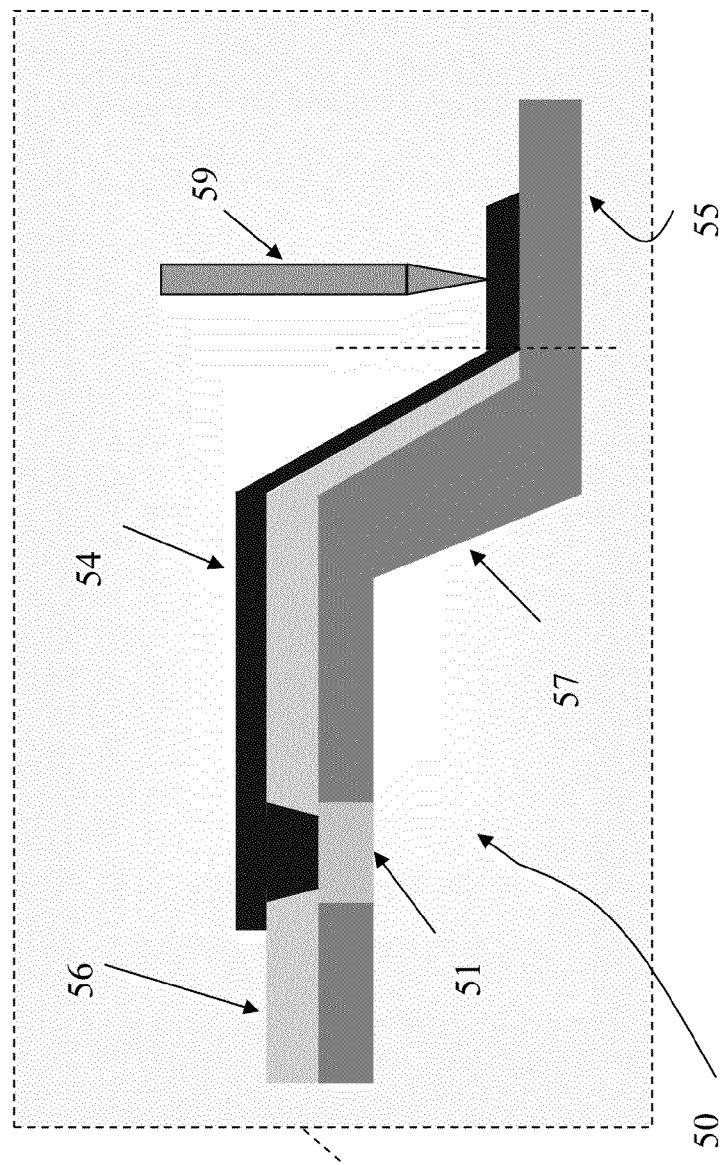
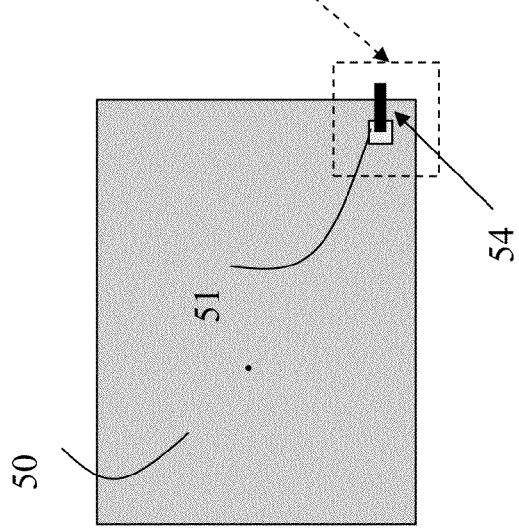
FIG. 12B
FIG. 12A

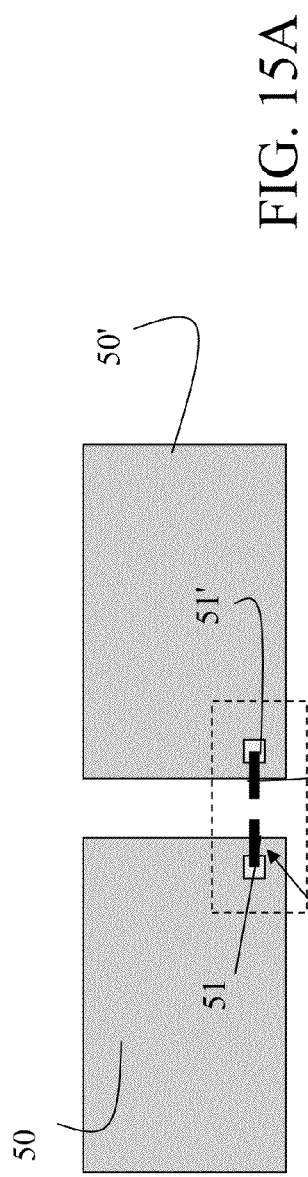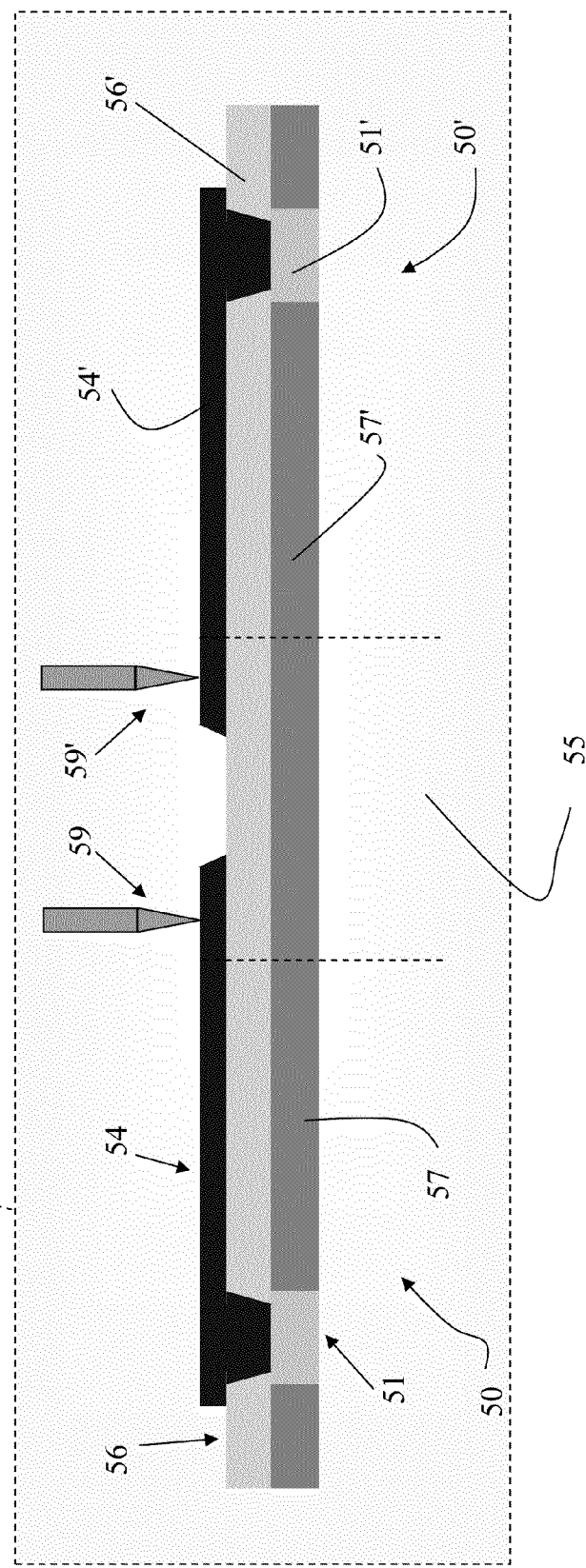

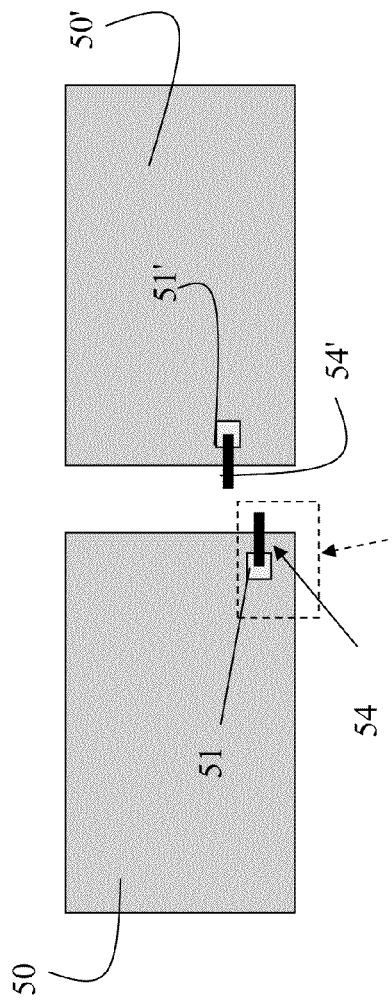
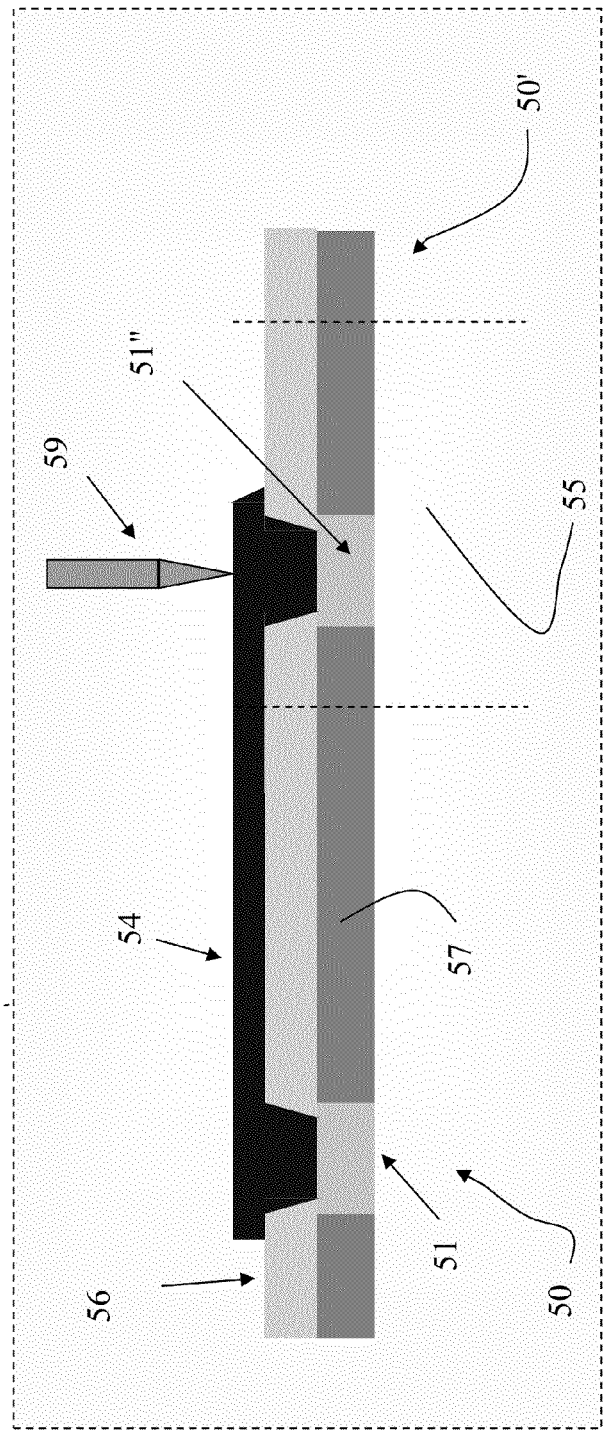
FIG. 17A
FIG. 17B

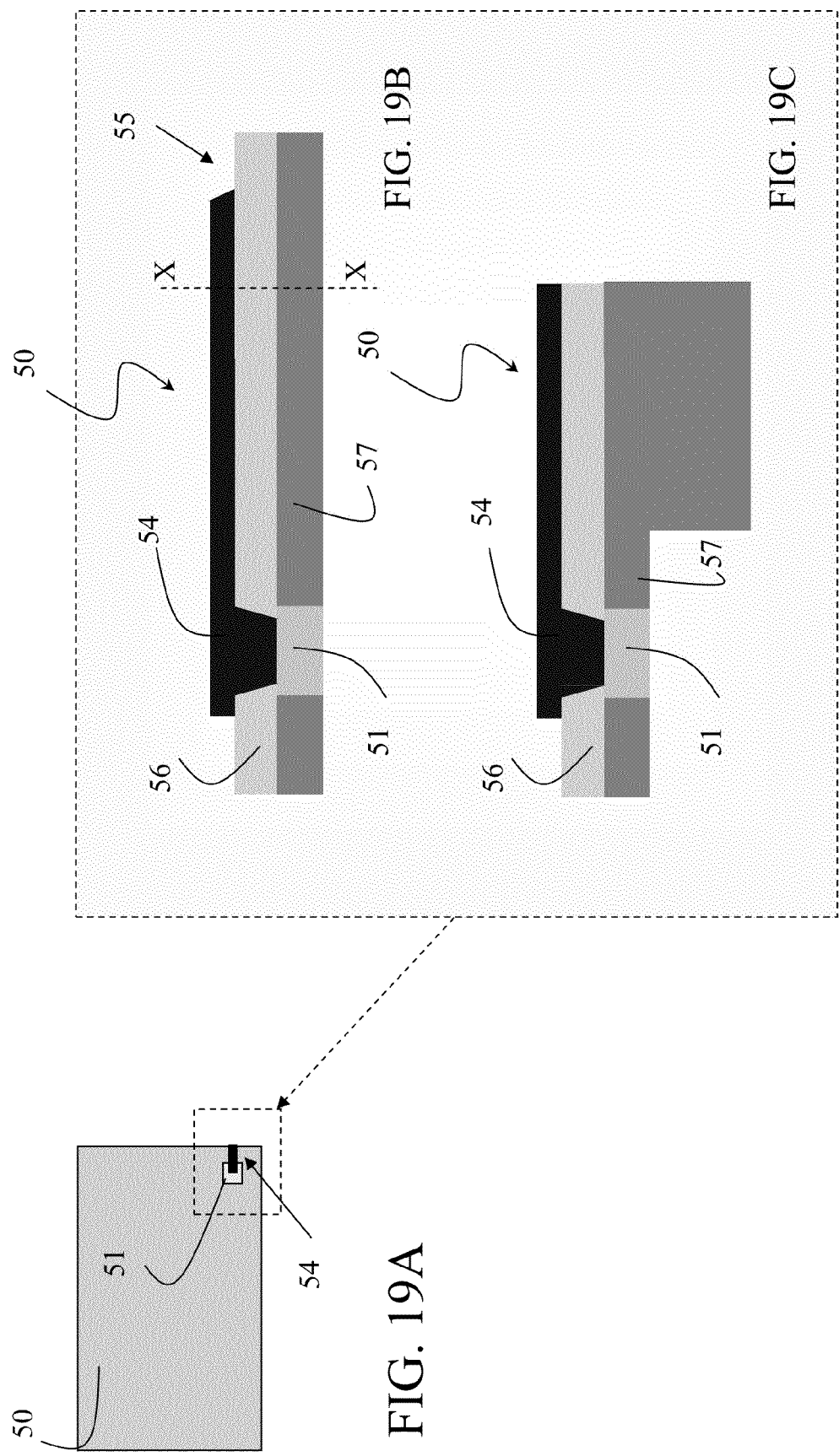

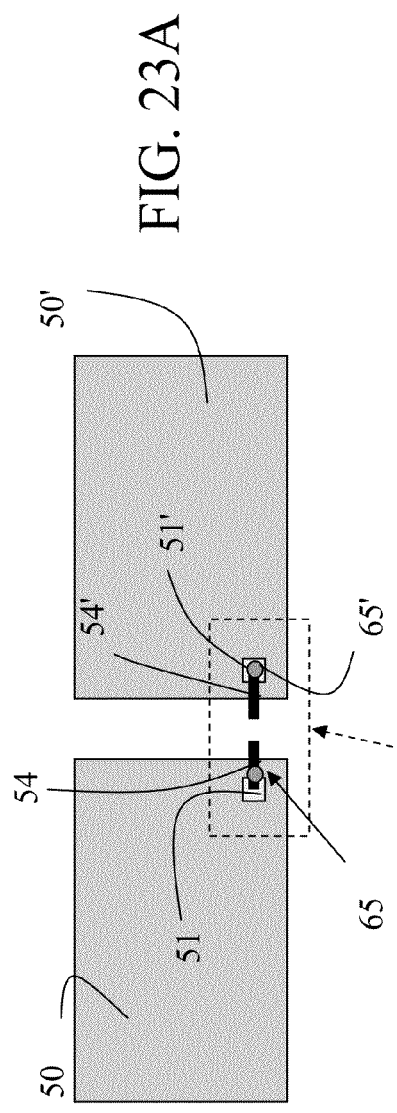
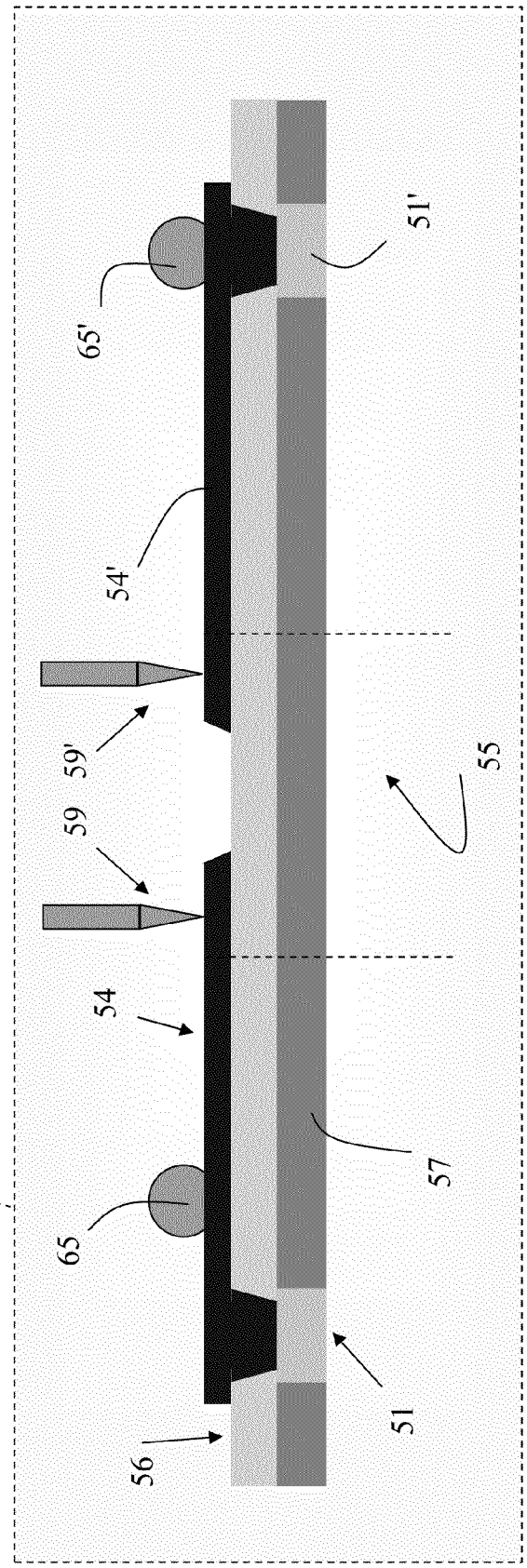
FIG. 23A
FIG. 23B

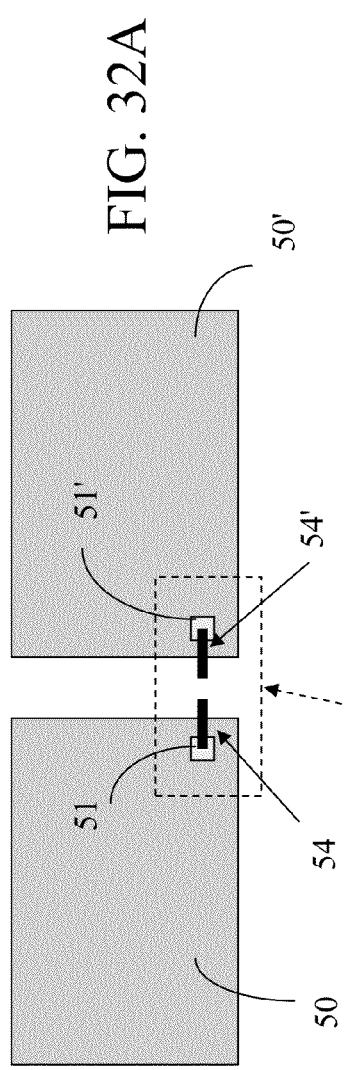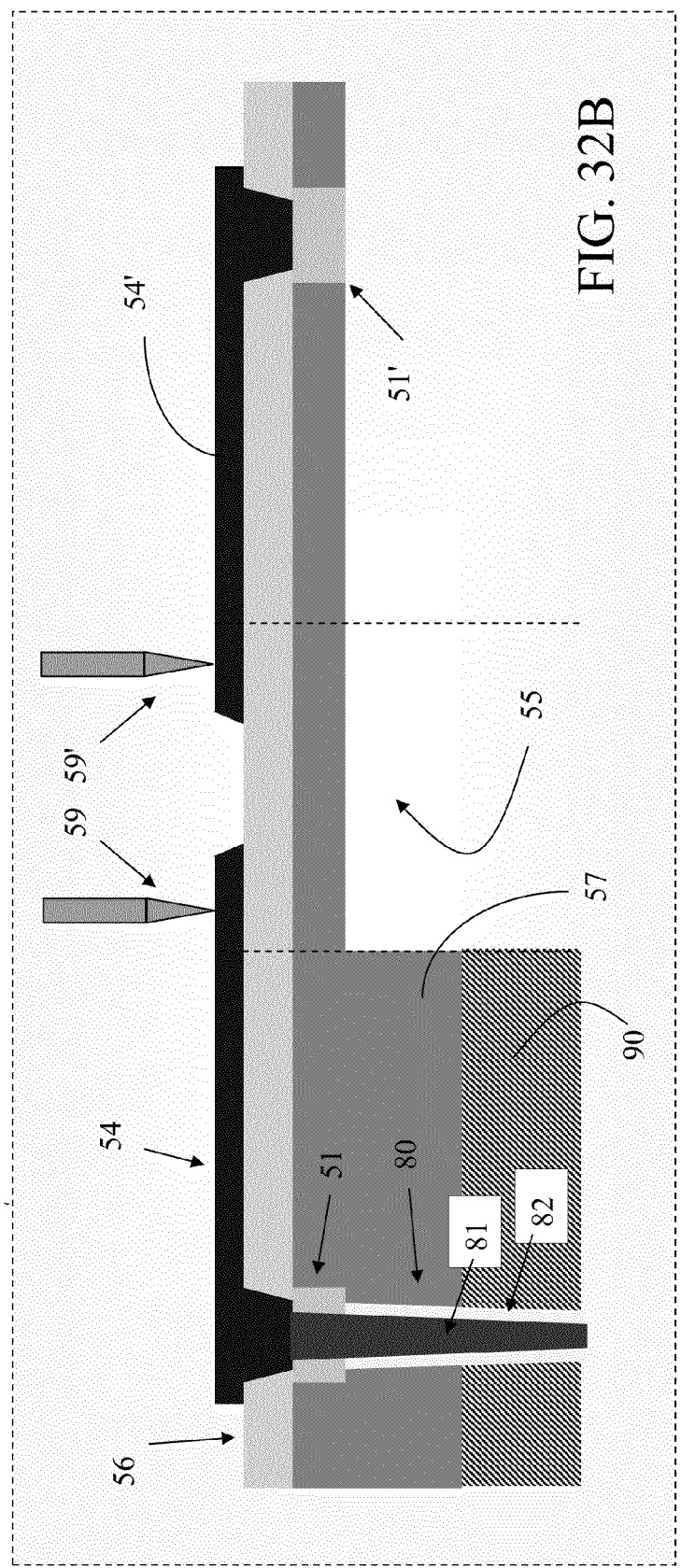

METHOD TO PERFORM ELECTRICAL TESTING AND ASSEMBLY OF ELECTRONIC DEVICES

BACKGROUND

1. Technical Field

The present disclosure relates to a method to perform electrical testing and assembly of electronic devices.

The present disclosure also relates to an electronic device comprised in a wafer comprising at least one pad made in an oxide layer covered by a passivation layer and subjected to electrical testing.

The present disclosure also relates to a multichip system in package.

The disclosure particularly, but not exclusively, relates to a method to perform an electrical testing and the assembly of electronic devices, of the type comprising for example a testing on wafer of the "Electrical Wafer Sort" (EWS) type or of the "Final Test" type or, again, testing of embedded devices "System in Package" (SiP), or, again, testing of the "Wafer Level Burn-In" (WLBI) type.

2. Description of the Related Art

As it is well known, one can perform an electrical testing on wafer of the EWS type, by electrically connecting a testing apparatus or tester to the wafer whereon there are the devices (dice or chips) to be tested, also called DUT (Device Under Test). In particular, a probe card is used, which serves as interface between the tester and the wafer. The probe card is a board generally comprising a printed circuit or PCB (Printed Circuit Board) and a plurality of probes (sometimes thousands) which electrically connect the tester to electric terminals of the DUT, usually made of pads.

After having been subjected to the electrical testing EWS, the wafers are cut and, subsequently, during the assembly and the packaging of the single devices, the step is carried out of electric connection between the devices and a support element which is part of the package wherein the devices are embedded, for example a substrate of a PCB or a "leadframe" or other type of support. In particular, the electric connection can be made through "wire bonding", a technique which forms conductive metallic wires (wire bonds), suitable for connecting the pads of the die to corresponding contact pins of the package. By way of example, FIG. 1A shows a die 1 being electrically connected to a support element 2 through conductive wires 3. FIG. 1B shows a detail of a section of the die 1 comprising, above a substrate 90, at least one oxide layer 4, wherein a pad 5 is made and whereon a passivation layer 6 is formed covering the oxide layer 4. The pad 5 is connected, in correspondence with a portion 5A thereof being free from the passivation layer 6, to the support element 2 of the package, and in particular to a contact portion 7 of the support element 2, through the metallic wire 3.

The use of probes that are positioned on the pads to electrically connect the tester to the wafer implies a damaging of the metal the pads are made of, creating big problems, not only during the testing or "probing", but especially during the assembly of the die. For example, FIG. 2A shows a DUT 10 comprising a plurality of pads 5, one of which is schematically shown from above in FIG. 2B. In particular, the pad 5 is made of a metallization layer (bond pad metallization) whose outline 13 is marked by a dot line, and this pad 5 is surrounded and partially covered by a passivation layer 6 whose outline 12 is marked by a continuous line corresponding to the opening (passivation opening) which determines the final size of the pad (bond pad size). If the probes of a probe card are placed on the pad 5, this latter can be damaged. The damaging of the exposed metallic surface 5A of this pad 5 is shown in particular in FIG. 2C, in which it is clear that, due to the positioning of a probe 14 on the metallic surface 5A of the pad 5, an irregular region 15 is formed called "probe mark" (which is indicated by blackened areas also in FIG. 2A). It is also to be considered that this damaging can be not limited to the sole metallic surface 5A of the generic pad 5, but extended also to underlying structures of the pad due to the force exercised by the probe on the pad and, after more successive probing, the pad can turn out damaged in different regions of the area being useful to perform the bonding. In particular, this damaging of the surface of the pad can imply a poor adhesion of the bonding metallic wire to the damaged surface, causing the detachment of the wire from the pad, or even a total lack of adhesion and, thus, the impossibility of creating an electric connection through wire bonding.

A further problem arises, when more dice should be embedded inside a package in "stacked" configurations for example of the pyramidal (pyramidal stacked), symmetrical (twin stacked), or with rotated overlapping (overhanging stacked) types, which consist in stacking different dice of different size one above the other, and then creating the connections between the dice and between die and support element of the package through wire bonding.

In fact, in this type of configuration it often occurs that the sizes of the upper die are limited to the position of the pads and of the corresponding wire bonding of the die.

To avoid this problem, the upper die at a suitable distance from the edge of the lower die or use a suitable insulating layer for spacing the lower die from the upper die. FIG. 3 shows, in section, a pyramidal configuration of a first die 1 and of a second die 1' stacked on the support element 2 of the package, each comprising, above a substrate 90, 90', an oxide layer 4, 4' in which a first pad 5, 5' is made and whereon a passivation layer 6, 6' is formed covering the oxide layer 4, 4', except in correspondence with a portion 5A, 5A' of the first pad 5, 5'. A first metallic wire 3 and a second metallic wire 3' electrically connect respectively the first pad 5 starting from the portion 5A and the second pad 5', starting from the portion 5A', to the support element 2 of the package. The second die 1' is separated from the first die 1 by an insulating layer 16.

A further problem arises during the performance of a testing of more devices in parallel, for which probe cards with a very high number of probes may be used. This determines an increase of the contacting problems and, thus, of electrical continuity, between the probe card and the wafer, i.e., between the probes and pads of the device to be tested, which causes successive probing on the same devices. In consequence, the electric yield decreases.

The situation in which below the pad metallization layer there is an oxide layer or, even more, a copper metallization layer is particularly sensitive for the probing through probes. In these cases, to avoid the exposure of the copper metallization layer to the oxidizing action of the air, an oxide grid is interposed between the copper metallization layer and the metallization layer of the pad. The pad thus obtained is defined "Studded Pad", since the presence of this grid makes the surface of the pad as if it were studded. Although the Studded Pad is advantageous in terms of protection of the layers underlying the pad, to form the protection oxide grid of the copper metallization layer, additional process steps are involved, which consequently burden and complicate the manufacturing of the device.

A further problem of the performance of a probing through probes is represented by the mechanical limits of the devices of last generation, which have a high number of pads to be contacted or pads with reduced area or also pads very close to each other, i.e., with reduced "pitch" or "fine pitch". In particular, for pads of small area, the breakage of the passivation layer surrounding the pad is more likely if probing is performed in an incorrect way. FIG. 4A shows a view from above of a DUT 10 comprising pads 5 wherein the probes 14 create a probe mark 15 (shown by the blackening of the contact sections on the pad 5) and are placed in a correct way (no error). The same DUT 10 is shown in FIGS. 4B, 4C and 4D respectively in the case in which the probes are placed in a non correct way along the axis X (X error), along the axis Y (Y error) or at an angle Θ (Yaw error (theta)).

Moreover, the temperature of the wafer and the temperature of the surrounding environment play a very important role during the performance of the probing. In fact, in case of pads with reduced size and of a high temperature of the wafer, for example much higher than 25 degrees centigrade, it can occur that at least one probe of the probe card, after having contacted the pad, moves on the pad itself due to the thermal expansion of the probe card, causing the breakage of the passivation layer surrounding the pad with a subsequent loss of electric yield. By way of example, FIG. 5A shows the section of one of the pads 5 shown in FIG. 4A, created in an oxide layer 4, covered by a passivation layer 6, in case a probe 14 is correctly placed on it, while FIG. 5B shows the section of the same pad 5, in case the probe 14 has moved (for example due to a thermal expansion of the probe card containing it) on the passivation layer 6 there creating a damaged region 16.

A known method for performing the probing of a device through probes consists in the insertion of suitable pads in the areas that separate the dice from one another, i.e., in the "scribe lines" of the wafer.

A solution of this type is described for example in U.S. Pat. No. 5,956,567, issued on Sep. 21, 1999 to Matsushita Electric Industrial Co., where secondary pads, external with respect to a chip, are inserted inside the scribe lines of a wafer, with the aim of supplying the chip. These secondary pads are connected in parallel, through metallization layers inside the chip, to primary pads which are inside the active area of the chip. In consequence, the primary and secondary pads are about at the same voltage and can be crossed by two currents that are then summed in a common node downstream of the pads themselves. The probing is, therefore, performed by means of probes positioned both on the primary pads and on the secondary pads.

This solution places some additional supply pads outside the chip to avoid area occupation inside the chip having to supply a high supply current. However, the probes being placed also on the primary pads inside the area of the device, this known solution shows the same probe damaging problems previously discussed.

A similar solution is described in U.S. Pat. No. 5,923,047, issued on Jul. 13, 1999, to LSI Logic Corporation, wherein some secondary pads are inserted inside the scribe lines of a wafer, to increase the distance between the adjacent pads (pad pitch). Also according to this known solution, the probing is performed both on the primary pads and on the secondary ones and, in particular, a probe connected to an inner pad of the chip is alternated with a probe connected to an external pad of the chip itself, increasing in this way the distance between two adjacent probes. Although advantageous under several aspects, this known solution shows the main disadvantage of not allowing to simultaneously test two adjacent chips, since it involves skipping at least one chip.

The problems linked to the performance of the probing through the probes of a probe card, placed on pads, are partially overcome by adding a metallization layer to the metallization layers of a device, this additional layer extending from a generic pad up to the passivation layer of the device, separating the area where the probing of the device is performed, or "Probe Region", from the area which is needed to perform the successive bonding, or "Wire Bond Region". This technique is usually called POP (acronym from: "Probe Over Passivation") and solutions of this type are described for example in U.S. Pat. No. 6,844,631, issued on Jan. 18, 2005 to Freescale Semiconductor, Inc. and in the publications "Novel Method of Separating Probe and Wire Bond Regions Without Increasing Die Size", L. Yong, T. A. Tran, S. Lee, B. Williams, J. Ross, 2003 Electronic Components and Technology Conference; "Problems with Wirebonding on Probe Marks and Possible Solutions", W. Saute, T. Aoki, T. Hisada, H. Miyai, K. Petrarca, F. Beaulieu, S. Allard, J. Power, M. Agbesi, 2003 Electronic Components and Technology Conference; and "A 44μ Probe Process Characterization and Factory Deployment Using Probe Over Passivation", B. Williams, T. Angelo, S. S. Yan, T. A. Tran, S. Lee, M. Ruston, 2003 SWTW.

A configuration corresponding to a solution described in U.S. Pat. No. 6,844,631 is freely schematized for example in FIG. 6, in which, in particular, the section of a pad, indicated with 20, is shown, being realized with copper and made in an oxide layer 21 covered by a passivation layer 22, as previously described. Above the pad 20 a metallization layer 23 is shown, in which a first region 24 on the left of the pad 20 covering the passivation layer 22 is devoted to the positioning of the probe for the electrical testing and, then, to the probing (Probe Region), while a second region 25, separated from the first region 24, covering the pad 20 is devoted to the bonding of the electric wires (Wire Bond Region). This configuration, besides solving the bonding problems during the assembly of a device, does not cause any damage of the passivation layer surrounding the pad and allows a remarkable reduction of the area of the pad itself and, consequently, of the device. Moreover, the additional metallization layer can be removed prior to the assembly steps for example through a suitable chemical action.

Although advantageous under several aspects, the solution just described implies that, performing the probing on a metallization layer placed above the passivation layer surrounding the pad, one or more layers underlying the metallization layer can be subjected to breakage. Moreover, the manufacturing process of the devices is complicated by the fact that additional process steps are used to realize the POP and create the additional metallization layer above the passivation layer.

The problems relative to the probing and to the successive step in which the electric connections to the chip are created, are mainly shown when the electrical testing is to be performed on wafers comprising devices with conductive bumps above the pads. For example, FIG. 7A shows the schematic view of a first and of a second DUT 10, 10' separated by a non-active region of scribe line 26 and FIG. 7B shows the section of an enlarged region of FIG. 7A comprising a pad 5 of the first DUT 10 and a pad 5' of the second DUT 10', both realized in an oxide layer 4, covered by a passivation layer 6, in correspondence with which there are respectively a first and a second metallic bump 27, 27'. In this case, to electrically connect the tester which performs the measures to the wafer whereon there are the devices to be tested, a probe card with suitable probes will electrically connect the tester to the bumps of the devices to be tested. Therefore, the probing of the wafer by means of probes is directly carried out on the bumps of the devices, that will be used also subsequently in the assembly step for establishing the electric connections to the support element of the package.

To perform the probing of the bumps, probe cards exist of different type realized with different technologies, for example by employing cantilever probes, vertical probes, pyramidal probes, VS crown probes. All these probe cards however cause in the bumps of the device a damage, that can be possibly reduced, by using suitable technologies and probing processes, as for example the one indicated as "Micro-Force Probing Technique" and described in U.S. Pat. No. 7,202,682, issued on Apr. 10, 2007 to FormFactor, Inc., which provides that, after having put probes of the MEMS type (Micro Electro-Mechanical Systems) in contact with the bumps, the chuck of the testing machine is made move obliquely instead of making it rise in a vertical direction, so as to reduce the shift or "scrub" of the probe on the bump without excessively decreasing the intensity of the contact force between the probe and the bump itself. In this way a smaller damage of the bumps is obtained with respect to that obtained with a traditional probing, damage that is however present.

In particular, further to one or more probing the bump is damaged in different areas of its area useful to perform the successive assembly and to create the electric connection. Therefore, the formation of electric connections can result remarkably jeopardized.

Moreover, the performance of the probing on bump is more problematic with respect to that of the probing on pad, since the bumps can show different heights with respect to one another and can be realized with also non planar geometries. And in the structures that show both the pad and the bump, the use of the probes for the probing often creates a damage on both.

To re-distribute the bumps inside the area of the die an optional, additional metallization layer or "redistribution layer" can be used that consists in a metallization layer being realized above the device itself, whose metallic paths start from the pads of the device and are arranged in the area of the device so as to form, in the end, a matrix of pads whereon bumps will be formed. This additional metallization layer is generally covered by a passivation oxide.

Also for the assembly of chips inside a package a redistribution layer can be used made of metallic paths, as described for example in the U.S. Pat. No. 6,861,761 issued on Mar. 1, 2005 to Advanced Semiconductor Engineering, Inc.

However, the creation of a redistribution layer implies additional process steps, that burden the assembly process, indeed.

BRIEF SUMMARY DISCLOSURE

One embodiment is a method to perform the electrical testing on wafer of electronic devices and the assembly of electronic devices, having such structural and functional characteristics as to allow to reduce the damaging of the pads or bumps of the chips during the testing step and to manufacture electronic devices with simple and low-cost processes, overcoming the limits and the drawbacks still affecting the methodologies of electrical testing and assembly of electronic devices according to the prior art.

One embodiment is a method to perform the electrical testing on wafer of devices comprising pads and/or the successive assembly of these devices inside a package through the use of extended metallization layers covering the pads that extend outside the active area of the devices themselves. In particular, the method provides that after the electrical testing the cut of the wafer is performed, through which the extended metallization layers are reduced at the edge of the devices and, subsequently, electric connections are created between the devices and a support element contained in the package, which can be a substrate of a PCB or a leadframe or other support, through wire bond (bonding) or bump (bumping) on the remaining portions of the extended metallization layers.

In particular, the cut of the wafer, reducing the extension of said at least one metallization layer at the edge of the electronic device, transforms it into an electronic device to be assembled comprising at least one metallization layer extended to the edge.

One embodiment is a method to perform electrical testing and assembly of at least one electronic device comprised in a wafer and comprising at least one pad made in an oxide layer covered by a passivation layer, of the type comprising the steps of: connecting said at least one electronic device to a testing apparatus; providing said electronic device with at least one metallization layer extending on said passivation layer from said at least one pad to a non-active area of said wafer. The method includes: performing the electrical testing on wafer of said at least one electronic device by positioning at least one probe of said testing apparatus on a portion of said at least one extended metallization layer comprised in said non-active area; performing the cut of said wafer, reducing the extension of said at least one metallization layer extended to the edge of said at least one electronic device; embedding inside a package said at least one electronic device, forming on said at least one metallization layer extended to the edge means suitable for establishing an electric connection to at least one circuit means comprised in said package.

One embodiment is an electronic device comprised in a wafer and comprising at least one pad made in an oxide layer covered by a passivation layer and at least one metallization layer extending on said passivation layer from said at least on pad to a non-active area of said wafer.

One embodiment is a multichip device embedded in a package comprising a support element and including: at least one first electronic device to be assembled comprising at least one metallization layer extended to the edge and connected to said support element through electric means suitable for establishing an electric connection placed on said at least one metallization layer extended to the edge; at least one second electronic device in stacked configuration with said at least one first electronic device.

One embodiment is a multichip system in package comprising at least one support element, and including a plurality of electronic devices comprising metallization layers extended to the edge, bumps and conductive metallic wires, through-silicon via (TSV) of the above indicated type.

Further characteristics and the advantages of the method, of the device and of the system according to the disclosure will be apparent from the following description of their respective embodiments given by way of indicative and non limiting examples with reference to the annexed drawings.

BRIEF DESCRIPTION OF THE SEVERAL VIEWS OF THE DRAWINGS

In these drawings:

FIGS. 4A-4D show views from above of a device to be tested comprising pads whereon there are probe marks further to the contacting of the probes, according to the prior art;

FIGS. 8A-8B, 9A-9B, 10A-10B, show views from above and enlarged, respectively, of different embodiments of devices to be tested on wafer, according to a first embodiment of the method according to the disclosure;

FIGS. 12A-12B, 13A-13B show views from above and in section, respectively, of a first and a second embodiment of a device to be tested on wafer, according to the first embodiment of the method according to the disclosure;

FIGS. 14A-14B, 15A-15B, 16A-16B, 17A-17B, 18A-18B show views from above and in section, respectively, of different embodiments of two devices to be tested on wafer, according to the first embodiment of the method according to the disclosure;

FIGS. 19A-19D show views from above of a first embodiment of a device to be assembled in a package, according to the second embodiment of the method according to the disclosure;

FIGS. 23A-23B show views from above and in section, respectively, of the first embodiment of two devices comprising a metallization layer extended to the edge with "bumps" to be tested, according to the first embodiment of the method according to the disclosure;

FIGS. 32A-32B show views from above and in section, respectively, of a first embodiment of a device comprising a TSV, according to a fourth embodiment of the method according to the disclosure;

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, metallization layer, or passivation layer, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

With reference to these figures, now the steps of a method of electrical testing and assembly of electronic devices according to the present disclosure are described.

In the following description, details and cooperating parts having same structure and similar operation will be indicated with the same references in the different figures.

It is suitable to note that the figures which show schematic views of portions of the device according to the disclosure are not drawn to scale, but are instead drawn so as to emphasize the important characteristics of the disclosure.

Figure 1B:
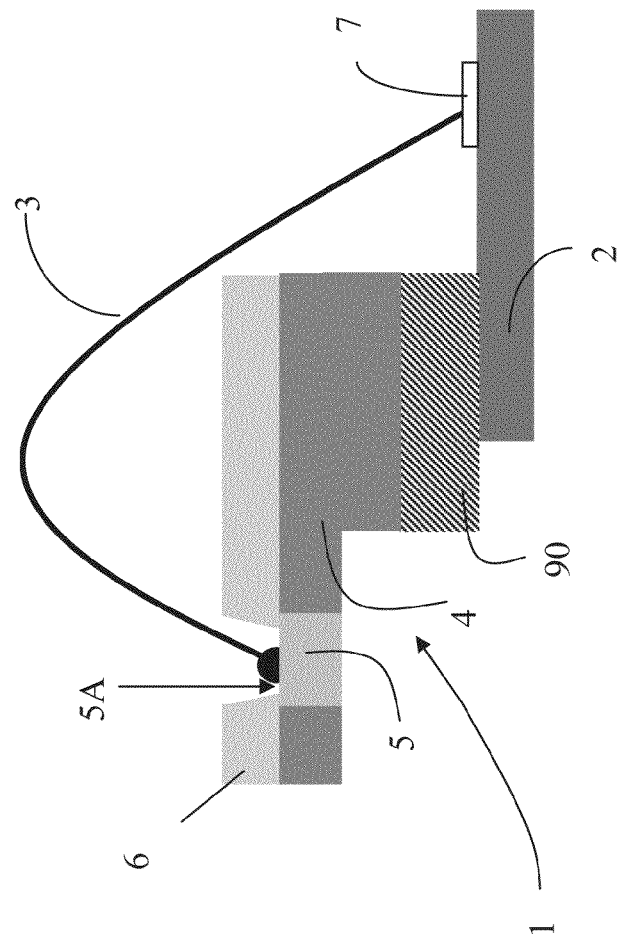
FIGS. 1A and 1B show section views from above of a device embedded in a package, according to the prior art.
Figure 1A:
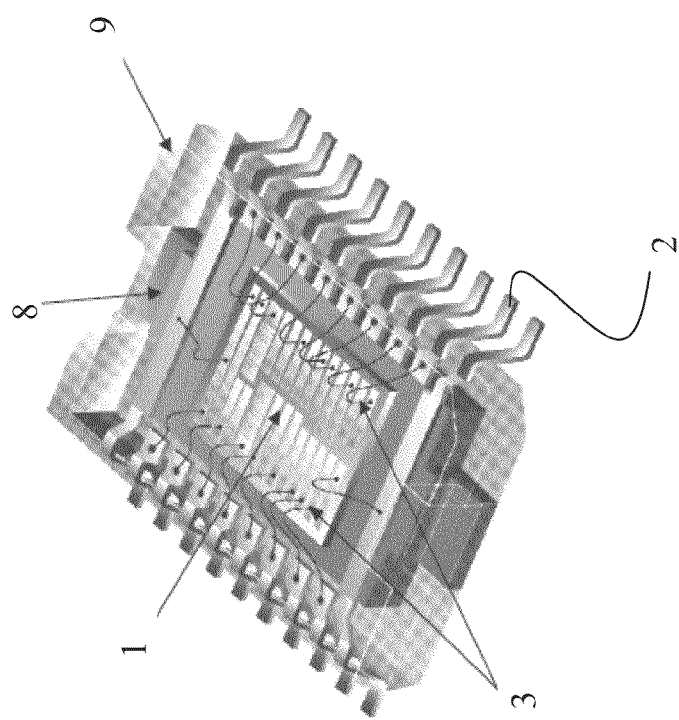
Figures 2A, 2B, 2C:
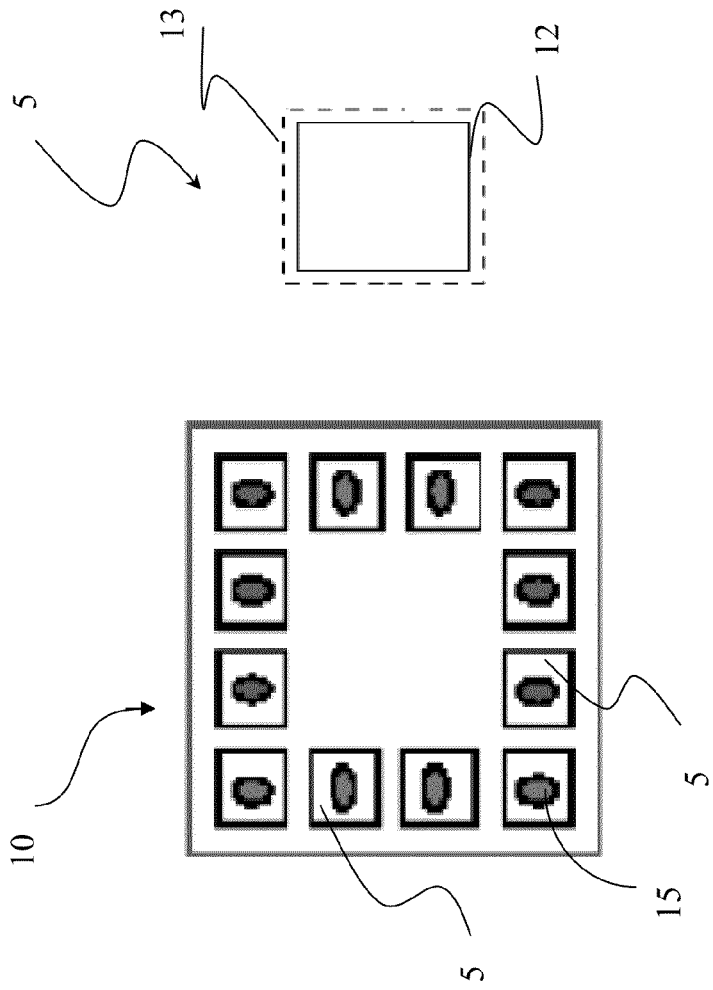
FIGS. 2A-2C shows views from above of a device comprising pads, of one of the pads and a section of a pad damaged by a probe, according to the prior art.
Figure 3:
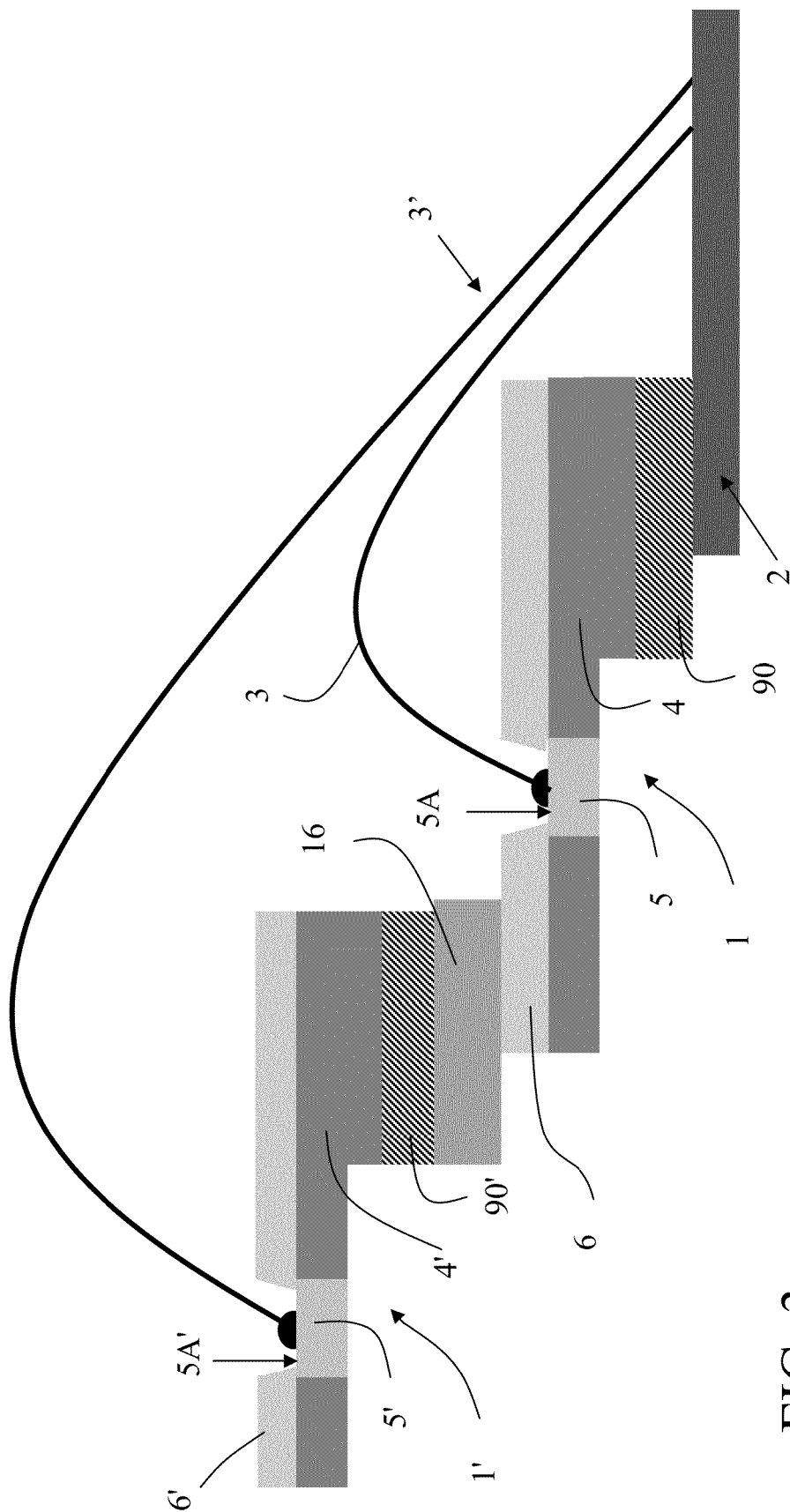
FIG. 3 shows a section of two devices stacked on the support element of the package in pyramidal configuration, according to the prior art.
Figures 5A, 5B:
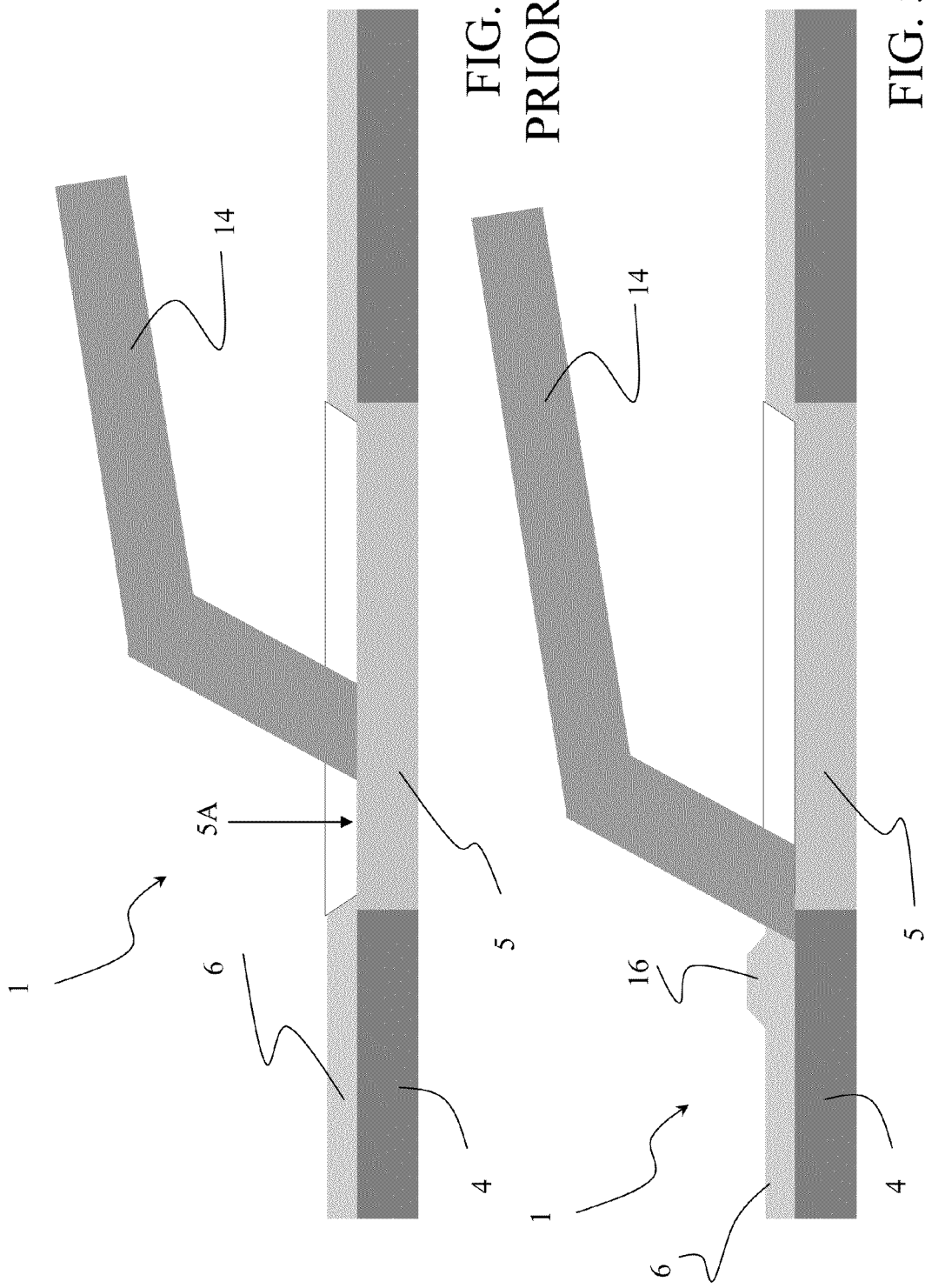
FIGS. 5A and 5B show in section one of the pads shown in FIG. 4 with a different positioning of a contacting probe, according to the prior art.
Figure 6:
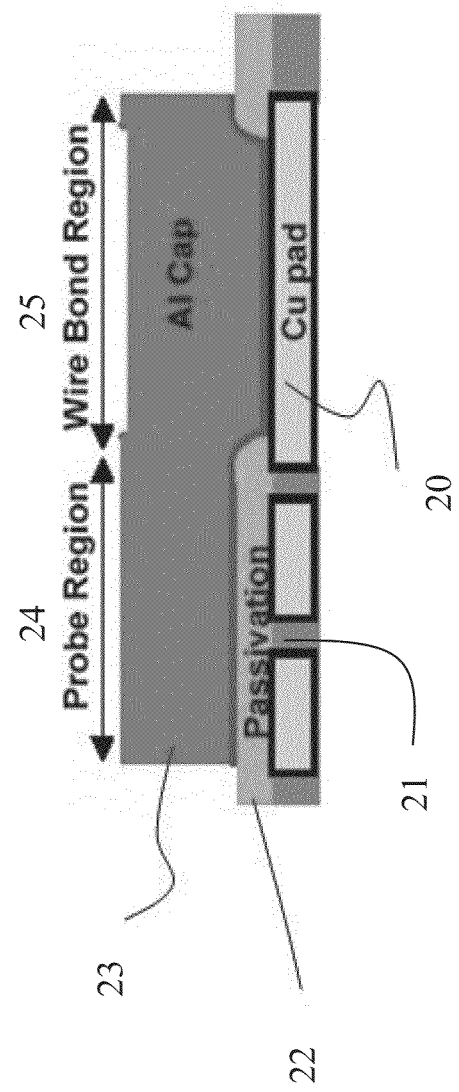
FIG. 6 shows a section of a pad subjected to testing through the technique "Probe Over Passivation" (POP), according to the prior art.
Figure 7A:
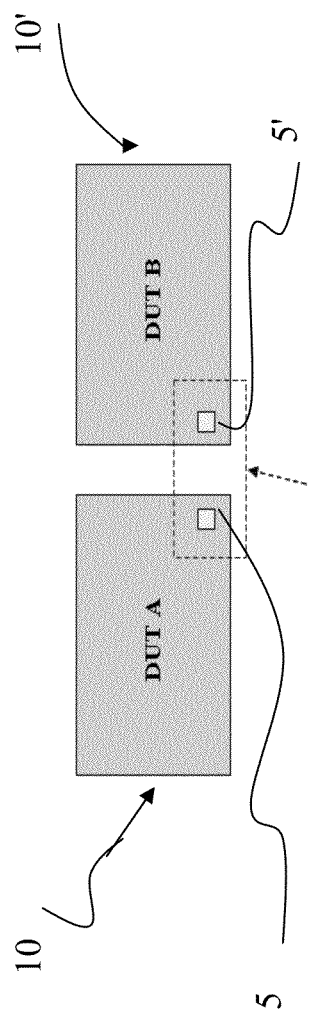
FIGS. 7A-7B show a view from above and in section of two devices to be tested on wafer comprising bumps, according to the prior art.
Figure 7B:
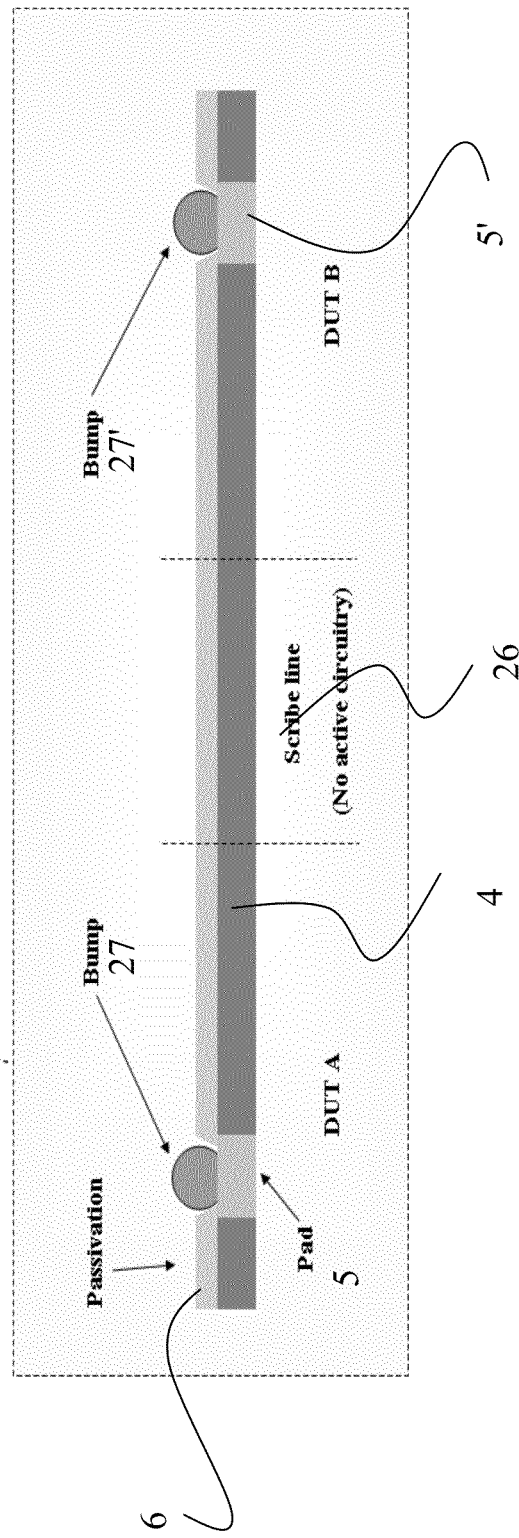
Figures 8A, 8B:
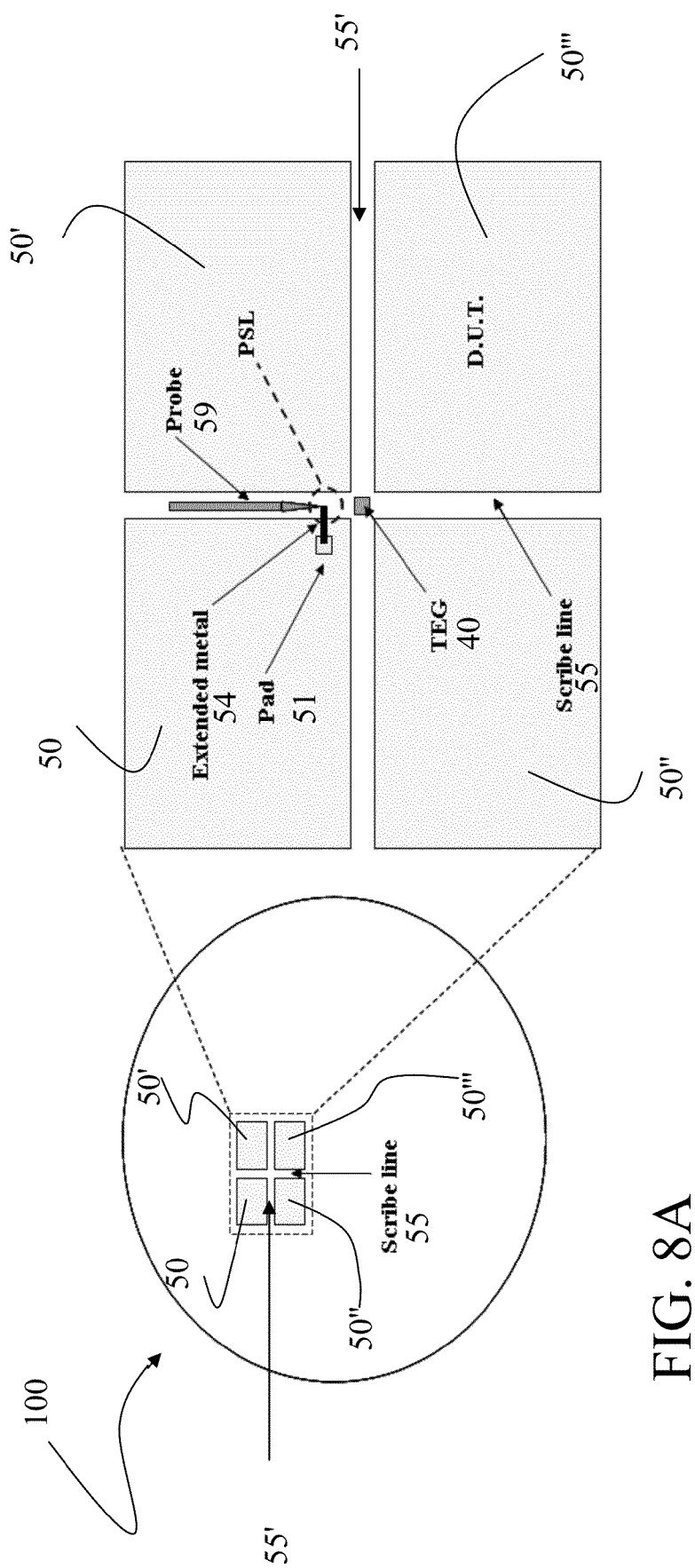

According to an aspect of the disclosure, FIG. 8A shows a view from above of a wafer, globally indicated with 100 comprising four DUTs 50, 50', 50" and 50'" separated by two scribe lines 55 and 55'. In particular, in the illustration convention adopted in FIG. 8A the scribe line 55 vertically separates the device 50 from the device 50' and the device 50" from the device 50'" respectively, while the scribe line 55' horizontally separates the device 50 from the device 50" and the device 50' from the device 50'", respectively.

FIG. 8B shows the enlargement of the four devices 50, 50', 50", 50'". The first device 50 comprises at least one pad 51 and one metallization layer 54 advantageously realized so that it extends from the pad 51 to a non-active area of the scribe line 55. In this way, as shown in FIG. 8B, on the extended metallization layer 54 a probe 59 can be placed, said probe being useful for performing the probing of the device during the electrical testing step, this operation being indicated as PSL ("Probing in Scribe Lines") in FIG. 8A.

In this way, advantageously according to the disclosure, the probing for the electrical testing of the single device is performed outside the active area of the device itself which, therefore, is not jeopardized in case of a possible breakage of the passivation 6 or of layers and structures underlying it, due to the force exercised by the probe.

Advantageously, the metallization layer 54 extends from the pad 51 to the scribe line 55 and can be created by adding to the standard manufacturing process one or more operations of lithography, of deposition and etching, or, alternatively, can be obtained through post-processing, i.e., by using additional process technologies different from the standard manufacturing process relative to the specific device, which have the advantage of being economically more advantageous, do not affect this standard process and are often less complex.

Advantageously, the extended metallization layer 54 can be eliminated at least in part through a suitable removal process which for example can be carried out through chemical etching during the assembly step, before or after the cut of the wafer, or immediately after the electrical testing of the wafer 100.

Advantageously extended metallization layers 54 can be present on one or more sides of a device.

FIG. 9 shows a view from above of the wafer 100 wherein all the four DUTs 50, 50', 50" and 50'" comprise a plurality of pads on each one of their sides. In particular, each of the DUTs 50, 50', 50" and 50''' comprises a plurality of pads, indicated in the figure with 41, 42, 43, 44, in correspondence with the side adjacent to the scribe line 55, and a plurality of pads, indicated in the figure with 41', 42', 43', 44', in correspondence with the side adjacent to the scribe line 55'; similar pluralities of pads for each of the four devices 50, 50', 50", 50''' are realized in correspondence with the sides opposed to the scribe lines 55 and 55'.

Advantageously, on each side of each DUT 50, 50', 50" and 50''' there are a metallization layers 45, 45', 46, 46', 47, 47', 48, 48' each extending from a pad to a non-active area of the adjacent scribe line.

Advantageously, according to an aspect of the disclosure and as shown in FIG. 9B, the arrangement of the extended metallization layers is chosen according to the arrangement of the pads of the DUT to be tested.

Figures 10A, 10B:
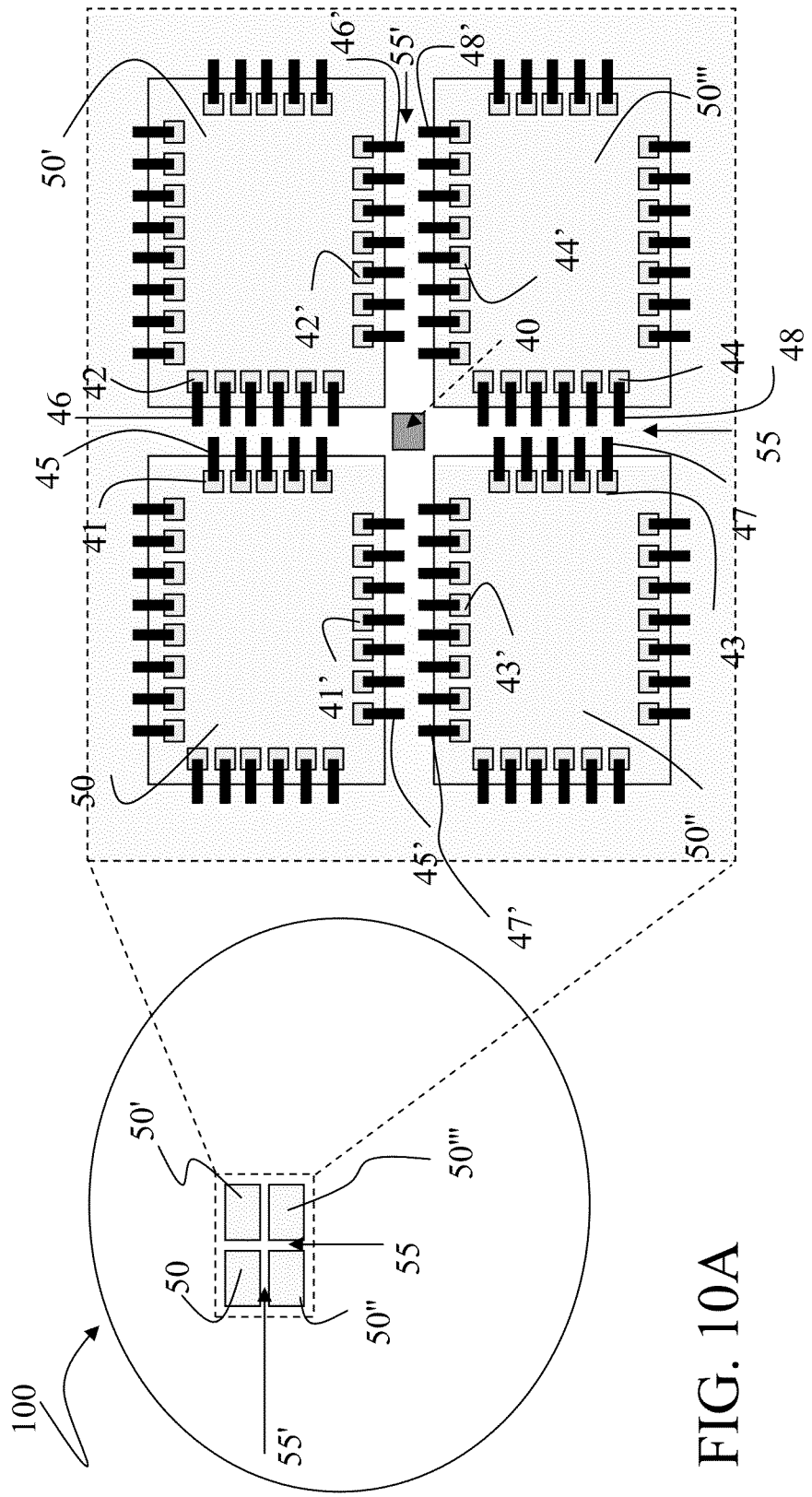

By way of example, FIG. 10A shows a view from above of a wafer 100 comprising four DUTs 50, 50', 50" and 50''' separated by two scribe lines 55 and 55'. Also in this embodiment, the devices comprise metallization layers advantageously realized so that they extend from the pads to a non-active area of a scribe line. FIG. 10B shows the enlargement of the four devices in case the pluralities of pads 41, 42, 43, 44 are misaligned with each other with respect to the scribe line 55, and the pluralities of pads 41', 42', 43', 44' are misaligned with each other with respect to the scribe line 55'. In this case also the extended metallization layers of a device have a misaligned arrangement with respect to the one of the extended metallization layers of the adjacent device.

Advantageously, according to this aspect of the disclosure, the misalignment of the extended metallization layers of a device with respect to the corresponding ones of the very close device simplifies the design of the probe card and avoids to create undesired short circuits between the contiguous extended metallization layers.

Advantageously by using a suitable arrangement and shaping of these extended metallization layers the distance between the probes can be increased. This can also allow to position the pads in the angles of the device, that will be then connected to the tester through the probes and the extended metallization layers. At present these angle regions of the device are not used since they are very critical for the positioning of the probes due to the mechanical ties of some technologies of probe cards.

Figure 11:
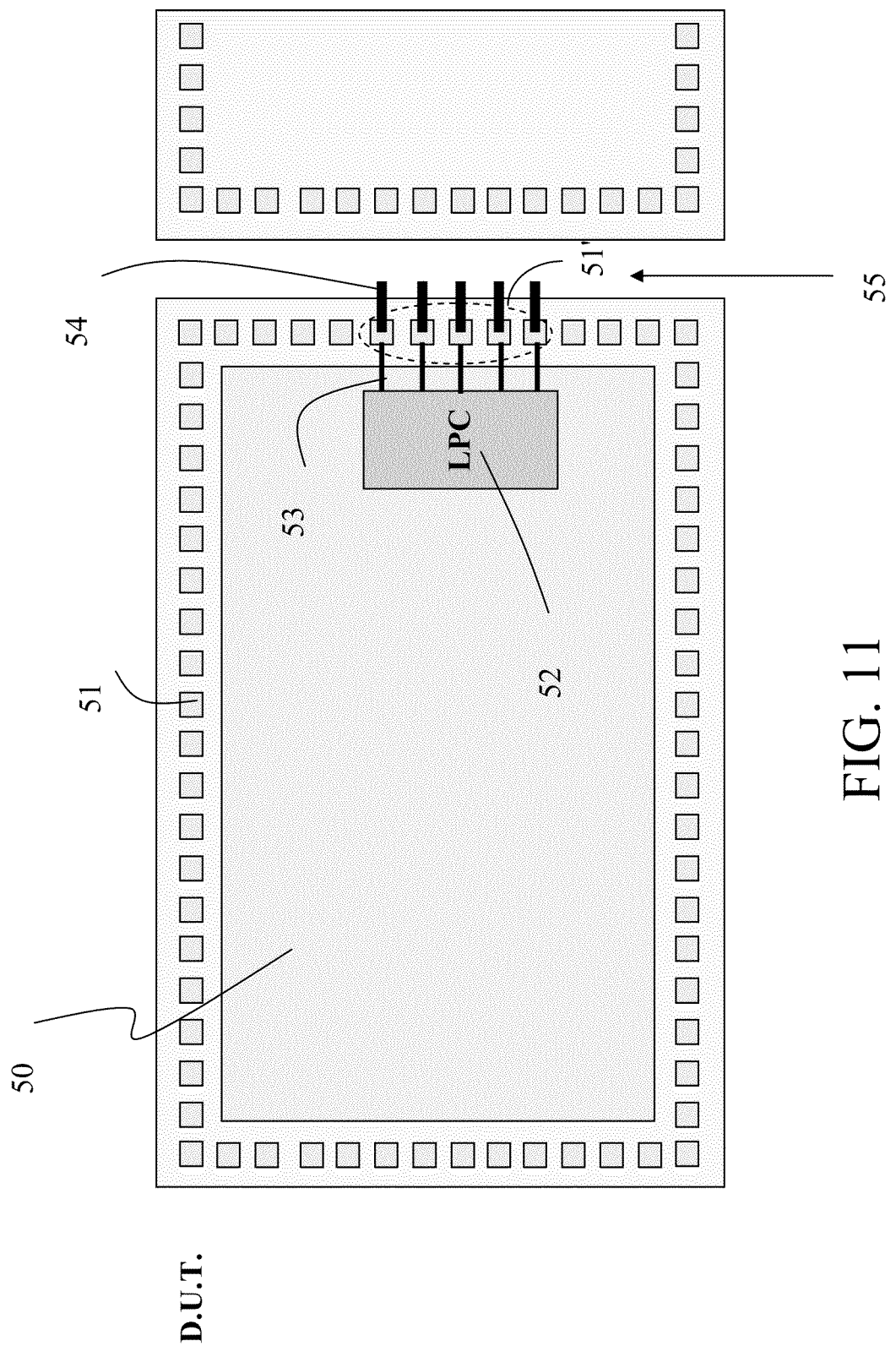
FIG. 11 shows a view from above of a first embodiment of a device to be tested on wafer, according to a second embodiment of the method according to the disclosure.

Advantageously, according to another aspect of the present disclosure, in a device comprising a testing interface in particular of the type LPC (acronym from: "Low Pin Count"), i.e., with a reduced number of pads or pins (which can be chosen among digital pins, supply pins and pins for analogue and radio-frequency signals), the extended metallization layers can be created on a limited number of pads of the device that in particular can coincide with the pads of the LPC interface, as shown by way of example in FIG. 11 for a DUT 50 comprising a plurality of pads 51 and a LPC interface 52 with a limited number of electrical terminals 53 connected to the same limited number of pads 51' of the device 50, whereon extended metallization layers 54 are formed.

The probing and the subsequent electrical testing of devices, according to the disclosure is thus realized by positioning the probes above the portions of the extended metallization layers which are in the scribe lines, thus creating a conductive path from the tester, for example an ATE (Automatic Test Equipment), up to the pads of interest of the device to be tested.

The probes can also be positioned on regions different from the scribe lines, where, in any case, there are no active areas of the device that can be damaged, for example the area of the seal ring which surrounds and separates the DUT 50 from the scribe lines, for sealing the circuits of the DUT 50 from the external environment.

In detail, FIG. 12A shows a DUT 50 according to the disclosure, comprising a pad 51 and an extended metallization layer 54, whose enlarged section is shown in FIG. 12B. In particular, in this section the pad 51 is shown realized in the active area of the device 50, surrounded by an oxide layer 57 covered by a passivation layer 56. Above the pad 51, the extended metallization layer 54 runs on the passivation layer 56 extending up to the scribe line 55 of the wafer, comprising a portion of the oxide layer 57. According to the method of the disclosure, a probe 59 connected to a tester is, then, positioned on the portion of extended metallization layer 54 which belongs to the scribe line 55 of the wafer.

In its most general form, the disclosure relates to a method to perform an electrical testing and the assembly of at least one electronic device 50 comprised in a wafer 100 which comprises the steps of:

providing the electronic device 50 with at least one metallization layer 54 extending from a pad 51 of the electronic device 50 to a non-active area, in particular to a scribe line 55 of the wafer 100;

performing the electrical testing on wafer of the electronic device 50 positioning at least one test probe 59 on a portion of the extended metallization layer 54 comprised in the non-active area, and in particular in the scribe line 55;

performing the cut of the wafer 100, reducing the extension of the extended metallization layer 54 to the edge of the electronic device 50, transforming it into an electronic device 50 to be assembled comprising at least one metallization layer 54 extended to the edge; and embedding inside a package the electronic device 50 to be assembled, forming on the metallization layer 54 extended to the edge means suitable for establishing an electric connection to at least one circuit means comprised in said package.

The circuit means comprised in the package can be made of a support element of the package, which in turn can be a substrate, when the package is a PCB, or a leadframe of the package or could be also made of a second electronic device 50', as it will be clarified hereafter in the description.

Figures 13A, 13B:
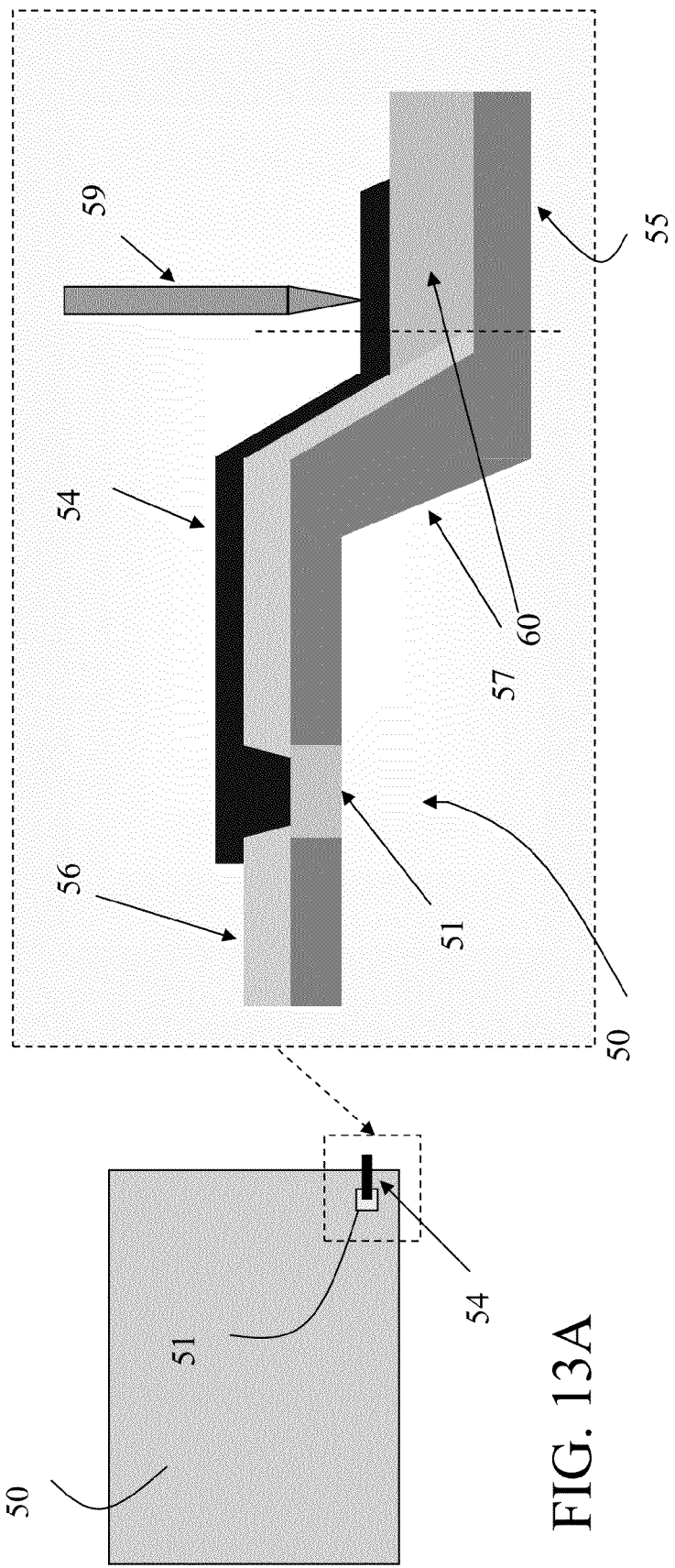

Advantageously, according to another aspect of the present disclosure, the scribe lines are filled in with electrically insulating filling materials or "fillings" so as to reduce the faultiness present in the scribe lines themselves and to move away from each other the metallization layers of contiguous devices. An embodiment of this type is shown in FIGS. 13A and 13B, where a DUT 50 is shown comprising a pad 51 with an extended metallization layer 54 and a corresponding enlarged section. In particular, in this section the pad 51 is shown, above which there is the extended metallization layer 54 which extends up to the scribe line 55 of the wafer comprising a portion of the oxide layer 57 covered by a filling insulating layer 60. A probe 59 connected to a tester is positioned on the portion of extended metallization layer 54 covering the filling layer 60.

Figure 14A:
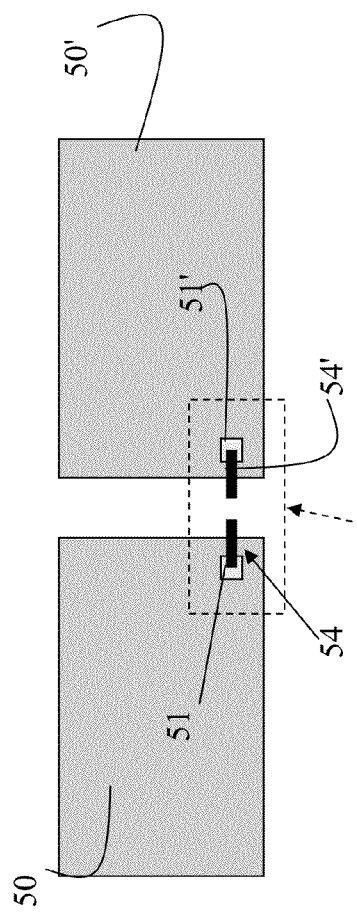
Figure 14B:
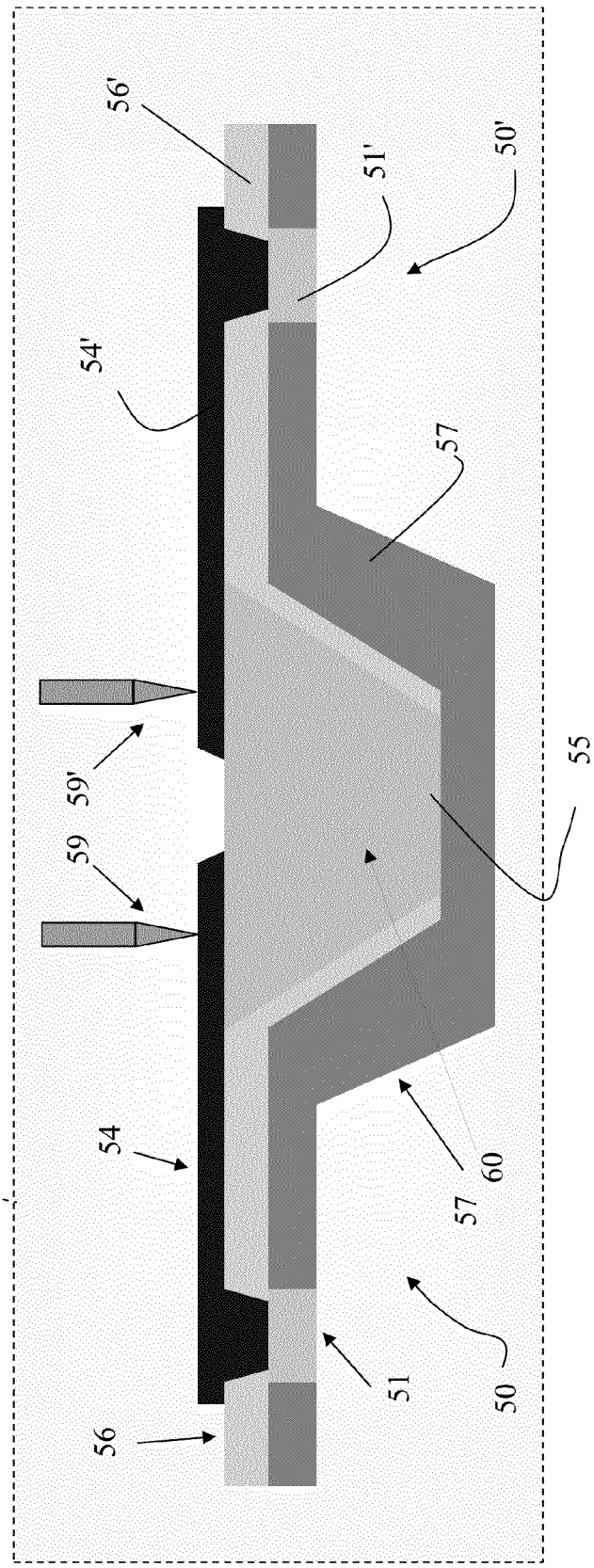

Advantageously, according to another aspect of the disclosure, the filling layer 60 completely fills in the scribe line 55, as shown in FIGS. 14A and 14B. In particular, as shown in these figures, the upper surface of the filling layer 60 is leveled to the one of the passivation layers 56 and 56', making it simpler and more reliable the creation of these extended metallization layers 54 and 54'.

As shown in FIGS. 14A and 14B, in the case of two adjacent devices 50 and 50', comprising respective pads 51 and 51' and respective extended metallization layers 54 and 54', each extended metallization layer is suitable for being contacted by a specific probe 59, 59'. In particular, FIG. 14B shows the enlarged section of the area of the pads 51, 51' of the devices 50 and 50' with the respective extended metallization layers 54, 54' and respective probes 59, 59' positioned on the portions of extended metallization layers 54, 54' which are in the scribe line 55 of the wafer.

Advantageously, according to another aspect of the disclosure, the upper surface of the scribe line is leveled to the one of the devices. For example, FIGS. 15A and 15B show two devices 50 and 50' similar to the previously described devices. As it can be seen, however, for example in FIG. 15B, the scribe line 55 only comprises a portion of an oxide layer 57 and a portion of an oxide layer 57' respectively comprised in the device 50 and in the device 50', and a portion of the respective passivation layers 56 and 56'

Figure 16A:
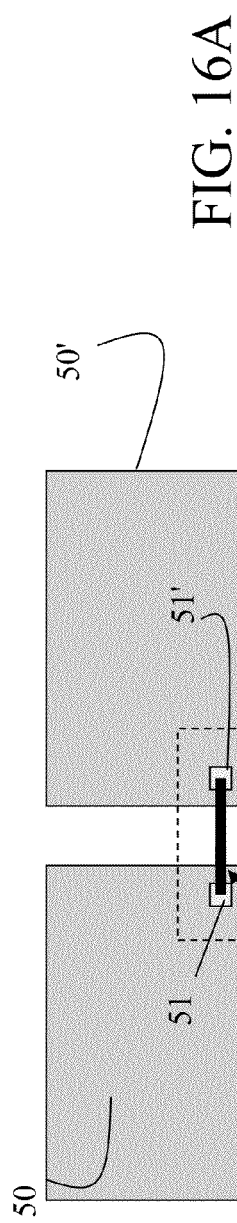
Figure 16B:
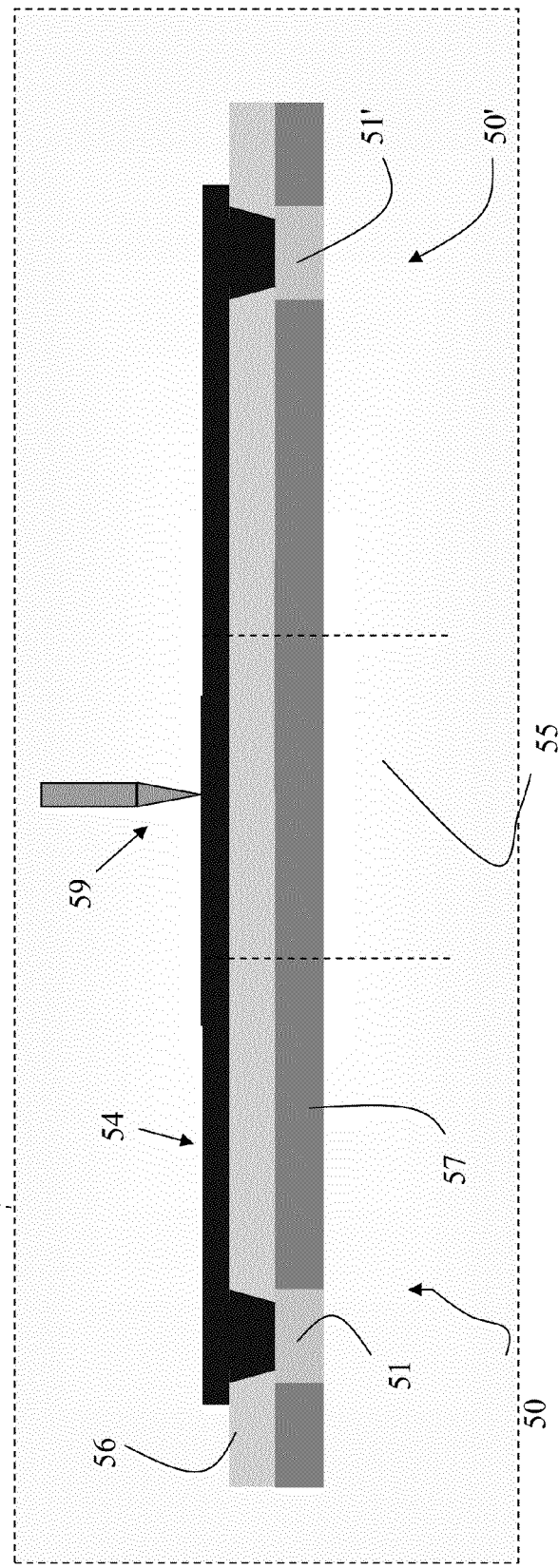

Advantageously, an extended metallization layer 54 can be shared by pads of two or more devices. For example, FIG. 16A shows two devices 50 and 50' comprising respective pads 51 and 51' sharing an extended metallization layer 54. In particular, the enlarged section of the area of the pads is shown in FIG. 16B, where it is clear that the common extended metallization layer 54 extends on a single passivation layer 56 formed above an oxide layer 57 shared by the two devices 50 and 50'. In this case, then, the scribe line 55 comprises a portion of the oxide layer 57, a portion of the passivation layer 56 and a portion of the extended metallization layer 54, and a probe 59 can be positioned on the resulting structure in correspondence with the scribe line 55. In this case, the two devices 50 and 50' are connected in common to the probe 59, which results to be advantageous when a supply or a same test signal is to be used for both the devices.

Advantageously at least one second probe (not shown in the figure) can be used on the same common extended metallization layer 54 for example to supply or withdraw a greater current or to measure the signal introduced by the first probe 59.

A dummy pad 51" can be comprised, in a known way, in the scribe line so as to be put in contact with the extended metallization layer 54 of the device 50, as shown in FIGS. 17A and 17B. A probe 59 is, then, positioned on the part of extended metallization layer covering the dummy pad 51". This makes the whole structure stronger since the first extended metallization layer 54 will be anchored to the first pad 51 and to the dummy pad 51", and moreover a greater thickness will be attained of metallic material where the probe 59 will have to be positioned.

Disadvantageously the addition of pads in the scribe lines increases the consumption of area on wafer, in terms of width of the scribe line itself if two adjacent devices have the respective pads arranged on two adjacent and distinct rows in this scribe line; in terms of increase of the pad pitch if adjacent devices have the respective pads arranged on a single row in the scribe line, since these pads have about the same sizes of the pads present in the device. An increase of the width of the scribe line consequently reduces the number of the devices present on the wafer with a subsequent economic disadvantage.

Moreover if these pads in the scribe line extend inside the scribe line itself, this implies that it is no longer possible to put in these areas of the scribe line the elementary microelectric structures (TEG: Test Element Group) used for the parametric testing of the wafer, which controls the parameters of the manufacturing process of the wafer itself.

Advantageously, according to an aspect of the disclosure, to make the structure mechanically stronger one or more blind "vias" can be created below an extended metallization layer, so as to extend the contact surface between the extended metallization layer and the passivation and oxide layers.

These blind vias can be positioned inside the active area of the single device and/or in the scribe line, and can be surrounded only by the passivation layer or also by the underlying oxide layer. The blind vias are particularly useful in case a signal that crosses the extended metallization layer is an RF or high frequency signal, since they allow to obtain, if desired, at least one partial improvement of the transmission line of the signal itself.

Figure 18A:
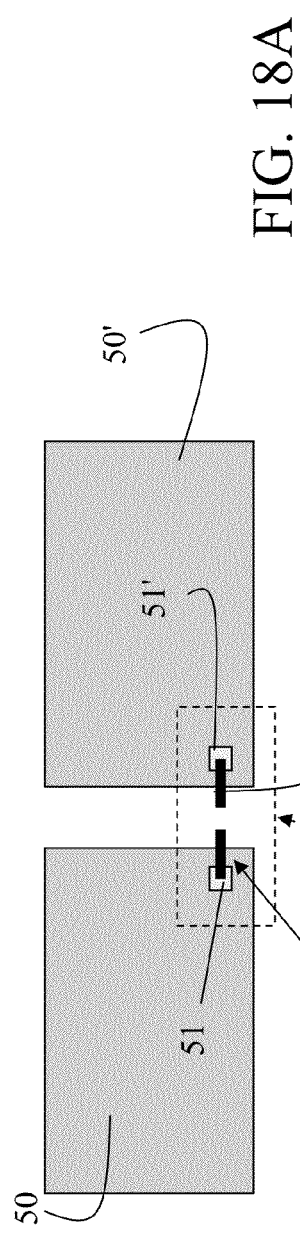
Figure 18B:
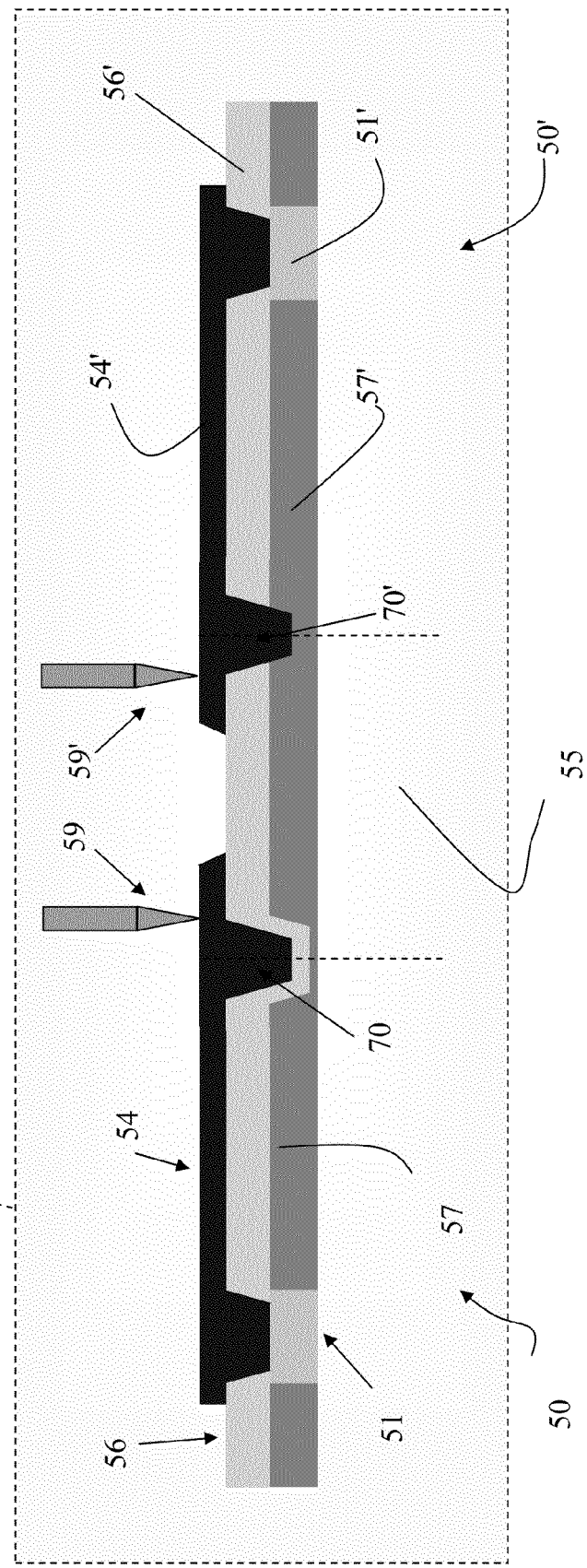

An embodiment of a wafer 100 according to this aspect of the disclosure is reported in FIGS. 18A and 18B, which show a first and a second device 50 and 50' respectively comprising a first and a second pad 51, 51' with a first and a second extended metallization layer 54, 54' (FIG. 18A). The enlarged section of the area of the pads 51 and 51' is shown in FIG. 18B, where a first and a second blind via 70, 70' are present in the edge area between the devices 50, 50' and the scribe line 55. The extended metallization layers 54 and 54' respectively extend inside the vias 70 and 70' and from here to the upper surface of the scribe line 55. In this case a first and a second probe 59, 59' can be positioned respectively on the part of the first and of the second extended metallization layers 54 and 54' covering the scribe line 55.

In the embodiment shown in the figure, the first via 70 extends in depth along the passivation layer 56 and the oxide layer 57, but is surrounded by the sole passivation layer 56, while the second via 70' extends at the same depth along the passivation layer 56' and the oxide layer 57', but it is surrounded by both.

After having performed the electrical testing, the wafer 100 is cut along the scribe lines and, in consequence, the portion of extended metallization layer used to perform the probing is eliminated, while the remaining portion reaches the edge of the device.

Advantageously, according to the disclosure the extended metallization layers of the devices are used also after the cut of the wafer to perform the electric connection, for example through wire bonding, with a support element contained in the package intended for containing the device. In fact, according to the method of the disclosure, the bonding is performed next to the perimeter of the single device, and, in particular, on these extended metallization layers rather than on the original pad of the device as considered. In this way the length of the single wire bond is reduced, and thus also the parasite effects due to its presence, which negatively influence mainly the signals in frequency. For example, FIG. 19A shows a device 50, wherein the extended metallization layer 54 reaches the edge of the device itself further to the cut of the wafer in correspondence with the line XX. FIG. 19B shows the enlarged section of the area of the pad 51 of the device 50 prior to the cut of the wafer, wherein the extended metallization layer 54 extends up to the scribe line 55, while FIG. 19C shows the same section after the cut of the wafer.

Figure 19D:
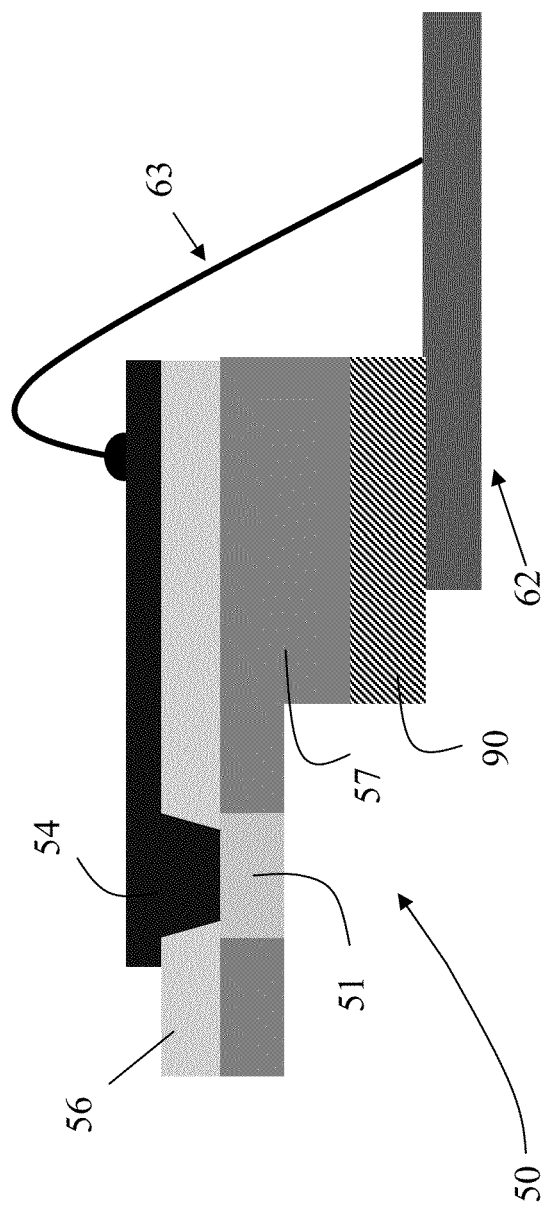

The presence of the extended metallization layer allows to create the wire bonding closer to the perimeter of the device on the extended layer itself, next to the pad or alternatively next to the edge of the device, rather than between the pad itself and the support element 62 of the package. FIG. 19D shows the device 50, further to the cut of the wafer, and a wire bond 63 which starts from the perimeter of the device 50 on the metallization layer itself 54 rather than on the pad 51 and connects the device 50 to the support element 62 of the package. The wire bond 63 has, therefore, a reduced length and, then, also a reduced resistance and inductance.

Figure 20:
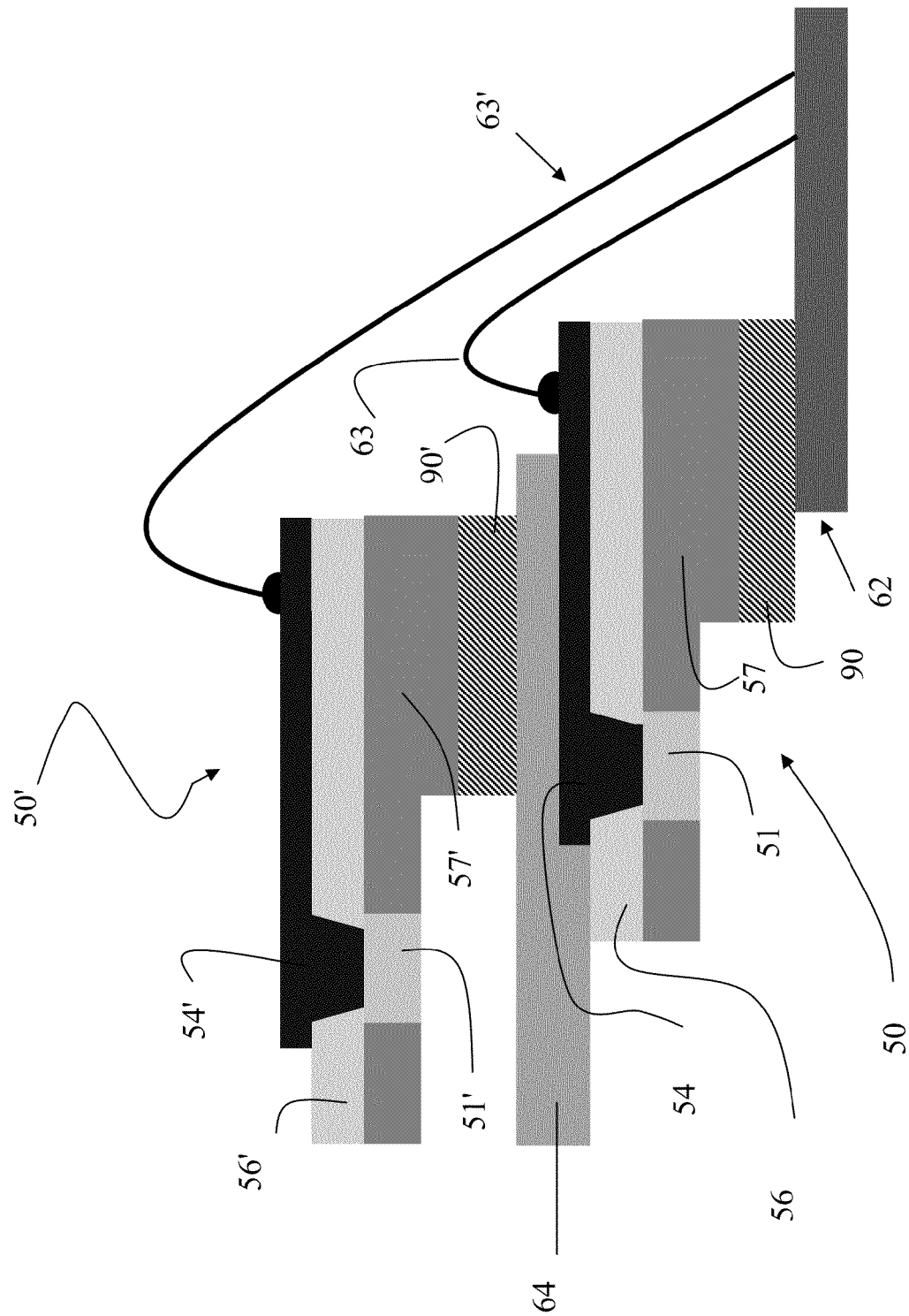
FIGS. 20-21 show, in section, a first and a second embodiment of two devices comprising a metallization layer extended to the edge assembled in a package, according to the second embodiment of the method according to the disclosure.

Moreover, the electric connection is not affected, in this case, by the damaging caused on the pad by the presence of the probe during the probing which causes adhesion problems between the wire bond and the damaged pad. Moreover, this methodology allows to easily create the electric connections with the support element 62 of the package also for pads far from the edge of the device and, in case it is desired to embed different dice in stacked configuration of the pyramidal type ("pyramidal stack") in a same package, it is possible to overlap more dice thanks to the greater useful area on the underlying die. In fact, with the use of the extended metals the upper die can be put also next to the edge of the underlying die, covering the pads of the underlying die whereto the extended metallization layer whereon the wire bond is created is connected. By way of example, FIG. 20 shows a first device 50 comprising a pad 51, above which a second device 50' is placed comprising a pad 51', separated from the first device 50 by an insulating layer 64. On the pads 51, 51' there are extended metallization layers 54, 54' which extend up to the edge of the devices 50, 50'. Moreover, the devices 50, 50' are connected to the support element 62 of the package respectively by means of a first and a second wire bond 63, 63', which respectively start from a portion of the extended metallization layers 54 and 54' next to the edge of the devices 50, 50'.

In a "stacked" configuration comprising more devices, some devices can comprise extended metallization layers and others can be devoid of them, according to the type of package wherein the dice are embedded.

Advantageously, on an extended metallization layer a plurality of electric connections can be created through wire bond, to connect one single pad to different points (or to another die or to the substrate of the package) of the device.

Advantageously, according to another aspect of the disclosure, an extended metallization layer can be created for each pad of the device whereon the bonding is carried out for the assembly inside a package.

Extended metallization layers can be used also in other types of "stacked" assemblies, for example of the "twin stacked", "overhanging stacked", or other type.

Figure 21:
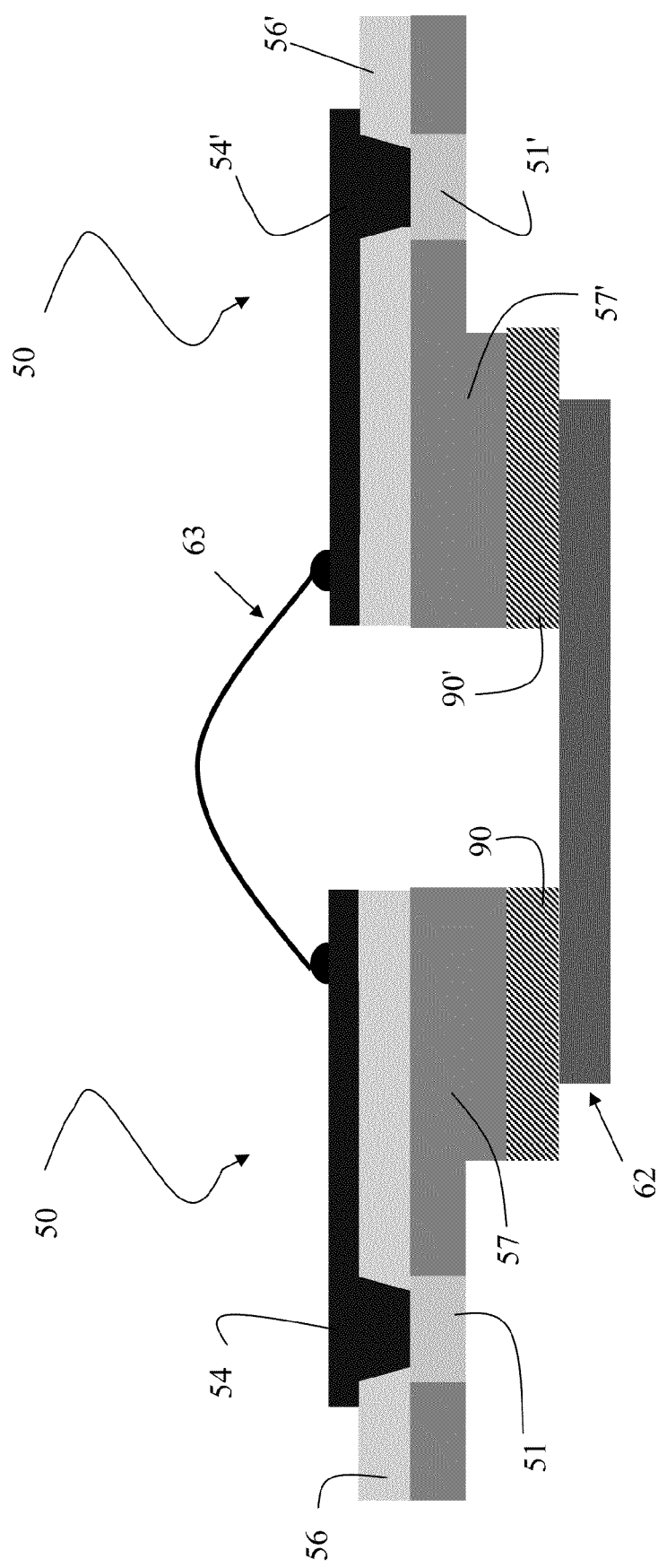

Advantageously, extended metallization layers can be used also for a "System in Package" (SiP). In a SiP the dice can in fact be positioned one next to the other, flanked in a coplanar way. Therefore, the presence of an extended metallization layer advantageously reduces the length of the wire bond used for their electric connection. An example of this embodiment is shown in FIG. 21, where a first and a second device 50, 50' are flanked and positioned on the support element 62 of the package. The devices 50, 50' comprise pads 51, 51', whereon there are extended metallization layers 54, 54' which extend up to the edge of the devices. A single metallic wire 63 electrically connects the two devices 50, 50' through the two extended metallization layers 54 and 54' respectively.

Figures 22A, 22B:
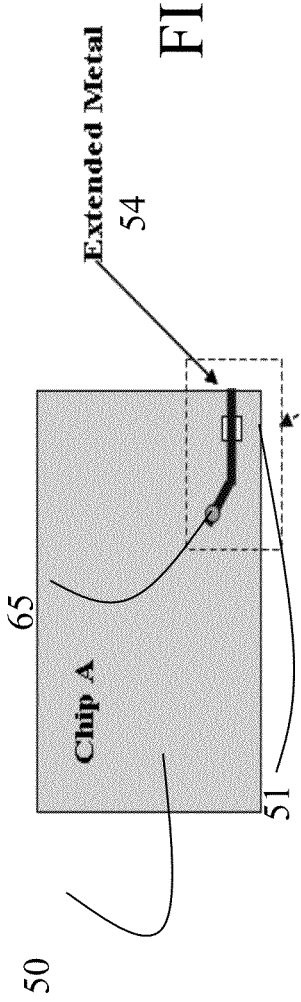
FIGS. 22A-22B show views from above and in section, respectively, of a first embodiment of a device comprising a metallization layer extended to the edge with "bumps" to be assembled in a package, according to the second embodiment of the method according to the disclosure.

Advantageously, extended metallization layers can be used also for devices with "bumps". In particular, an extended metallization layer which starts from a pad of the device could be used for redistributing the bumps on the area of the device and also for creating electric connections through wire bond or bump. FIG. 22A shows a device 50 comprising a pad 51 and a bump 65, realized above an extended metallization layer 54. FIG. 22B shows the enlarged section of the area of the pad 51. Both the bump 65 and a wire bond 63 are positioned on the extended metallization layer 54. Advantageously, bump and wire bond can be positioned at any point of the extended metallization layer, and the number of bumps and wire bonds created on the extended metallization layer can be chosen according to the will.

Advantageously, moreover, the path of the extended metallization layer can be suitably chosen according to the need.

Advantageously, finally, the extended metallization layer is created on the wafer through a diffusion process or post-processing after having created the integrated circuits.

According to an embodiment of the method according to the disclosure, first the extended metallization layer is created above which the bumps are then created, as shown for example by FIGS. 23A and 23B. In these figures two devices 50 and 50' are shown with respective bumps 65 and 65' and extended metallization layers 54 and 54' which extend from pads 51 and 51', up to the scribe line 55. Subsequently the electrical testing of the devices is performed with the method according to the disclosure, i.e., without damaging the bumps 65, 65'. FIG. 23B shows two probes 59 and 59' positioned on the portions of the extended metallization layers 54 and 54' in correspondence with the scribe line 55.

Alternatively, according to another embodiment of the method according to the disclosure, after the creation of the extended metallization layer the electrical testing of the devices 50 and 50' is performed with the method according to the disclosure, and only subsequently the bumps are created.

Alternatively, the bumps can be created before or after the cut of the wafer.

Advantageously, as shown in FIGS. 23A and 23B, the bumps can be created in any area of the same extended metallization layer, in particular in a point different from the one where the probes are positioned, thus avoiding the problems due to the damaging of the bumps themselves further to the probing.

Moreover, through the extended metallization layer the bumps can be redistributed inside the area of the device, since they can be positioned anywhere on the extended metallization layer 54 with respect to the pad 51.

Advantageously, on the extended metallization layer both wire bonds and bumps can be formed, and, in consequence, the electric connections with the substrate of the package or between chip and chip can be realized both through wire bond and through bump.

Figure 24:
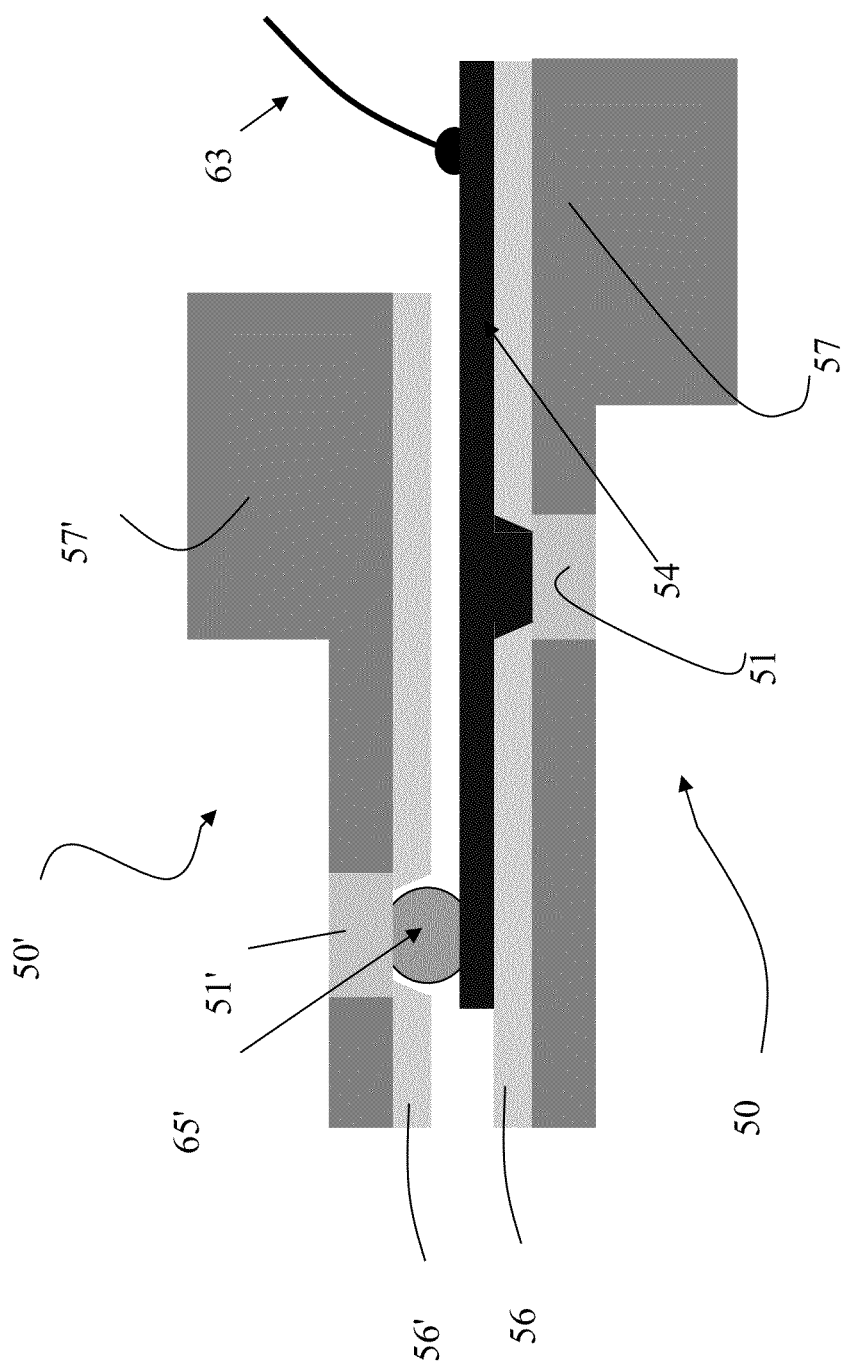
FIGS. 24, 25, 26, 27, 28, 29, 30A-30B, 31 show, in section, different embodiments of stacks of devices, according to a third embodiment of the method according to the disclosure.

According to an embodiment of the method according to the disclosure, it is possible to stack two chips in "face to face" configuration and connect them to each other through a bump and to the rest of the circuit through a wire bond. By way of example, FIG. 24 shows a first device 50 comprising a pad 51 and a corresponding extended metallization layer 54. A bump 65 connects the first device 50 to a second device 50' in correspondence with a pad 51' thereof. A wire bond 63 connects the first device 50 to the remaining circuit, not shown in the figure.

Advantageously, the extended metallization layer can be used in its whole extension inside the area of the device 50.

Advantageously, the extended metallization layer can be covered at least partially by an insulating oxide layer or by a passivation layer.

Advantageously, by creating a single pad for device it is possible to connect the same signal to the rest of the circuit through bumps and wire bonds created above the extended metallization layer.

Advantageously, the extended metallization layers can be present on a single chip or on more chips inside a package.

Figure 25:
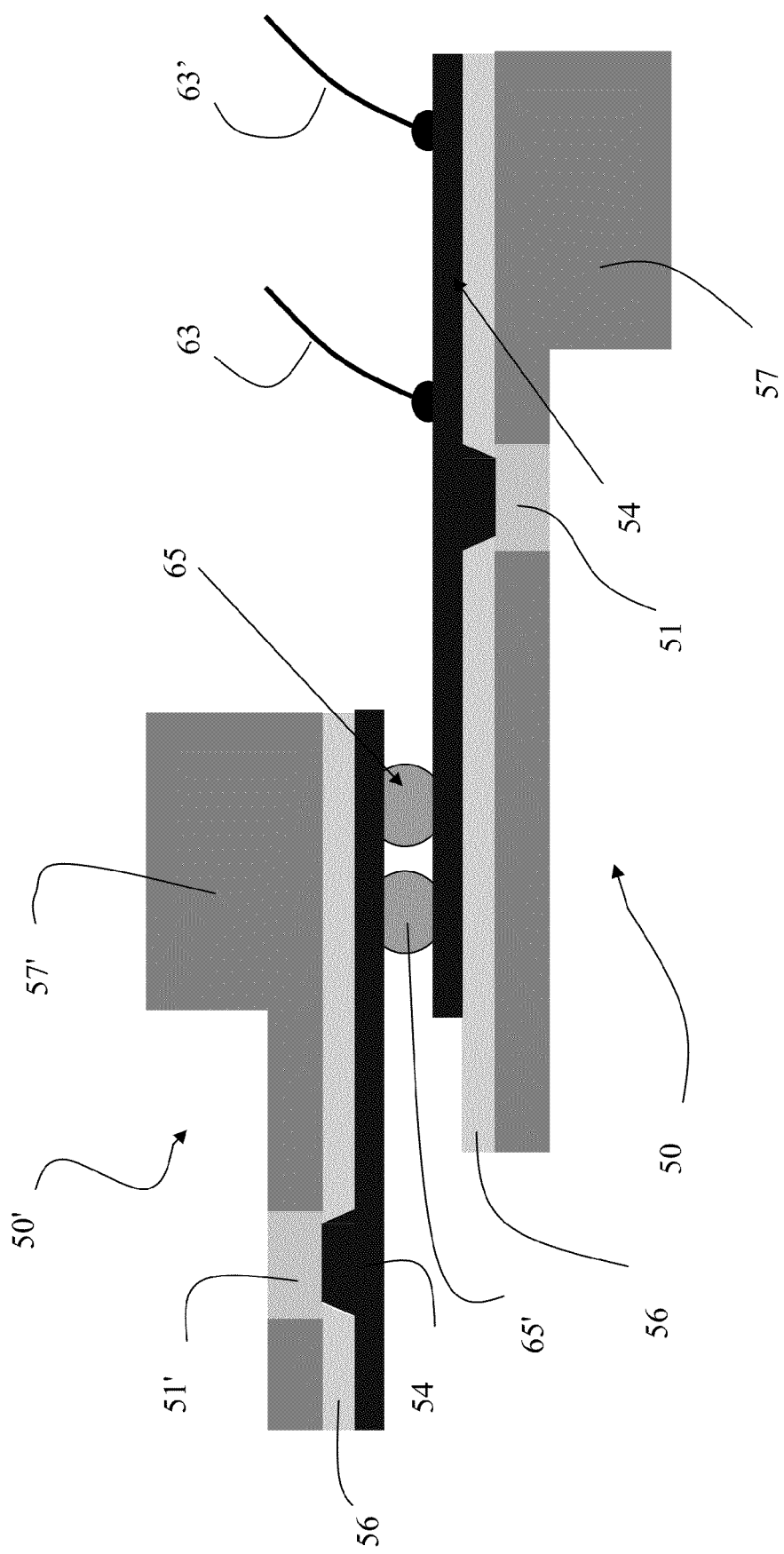

Advantageously, having the whole extended metallization layer, more wire bonds and/or more bumps can be used for creating a connection between chip and chip or between a chip and the rest of the circuit. FIG. 25 shows a first and a second device, 50 and 50', whose extended metallization layers 54 and 54' are connected to each other by means of two bumps 65, 65'. Two wire bonds 63 and 63' instead connect the first device 50 with the remaining circuit not shown in the figure.

The presence of more bumps reduces, due to connection redundancy, the problems caused by the fact that some bumps can be faulty. Moreover, the resistance of the electric connection through bump is reduced and, in consequence, the intensity of the current flowing through the connection itself is greater.

Figure 26:
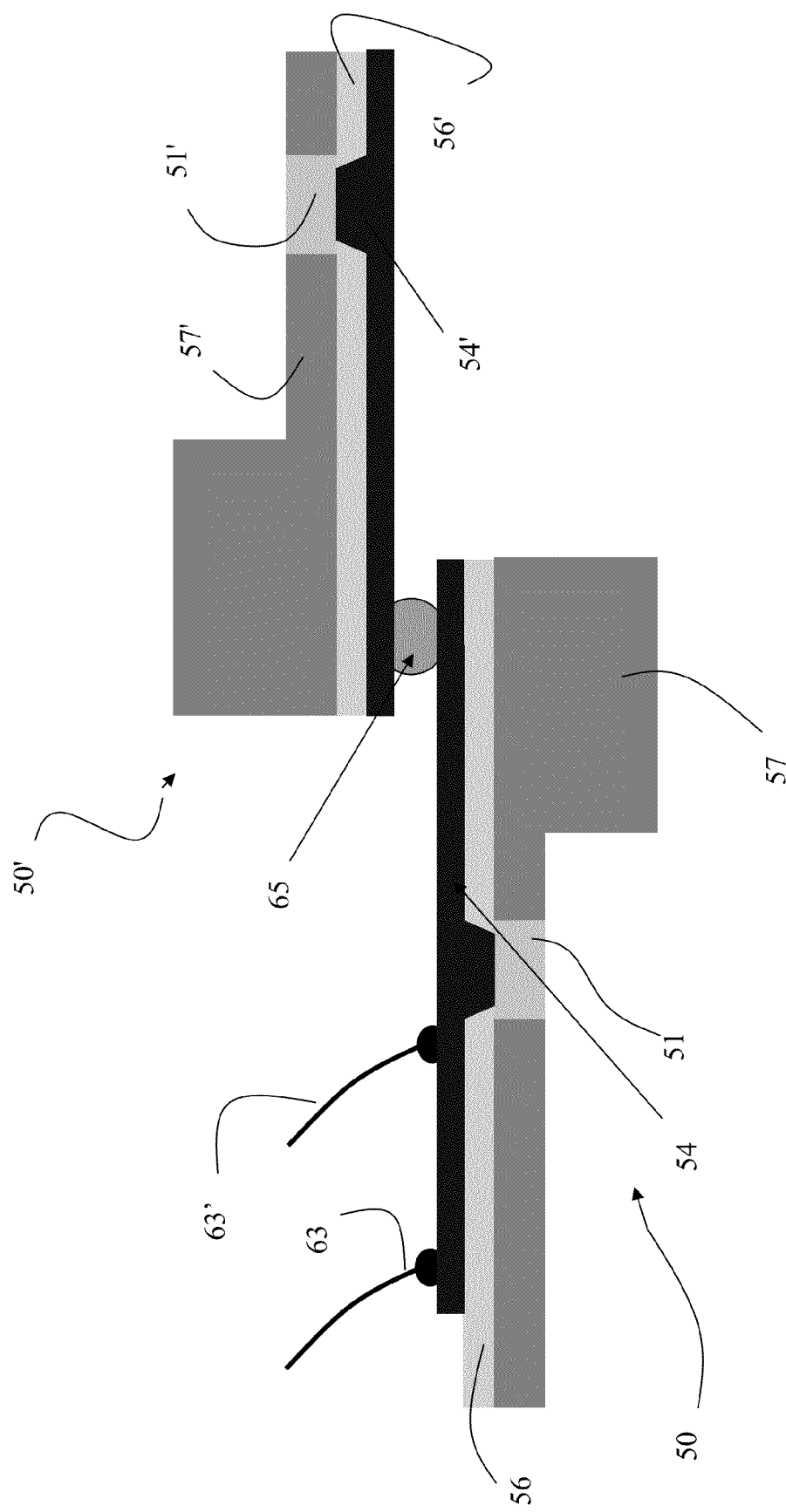

Moreover, in this way two face-to-face chips can be connected that are also very misaligned with respect to each other, as shown in FIG. 26, for a first and a second device 50 and 50'.

Figure 27:
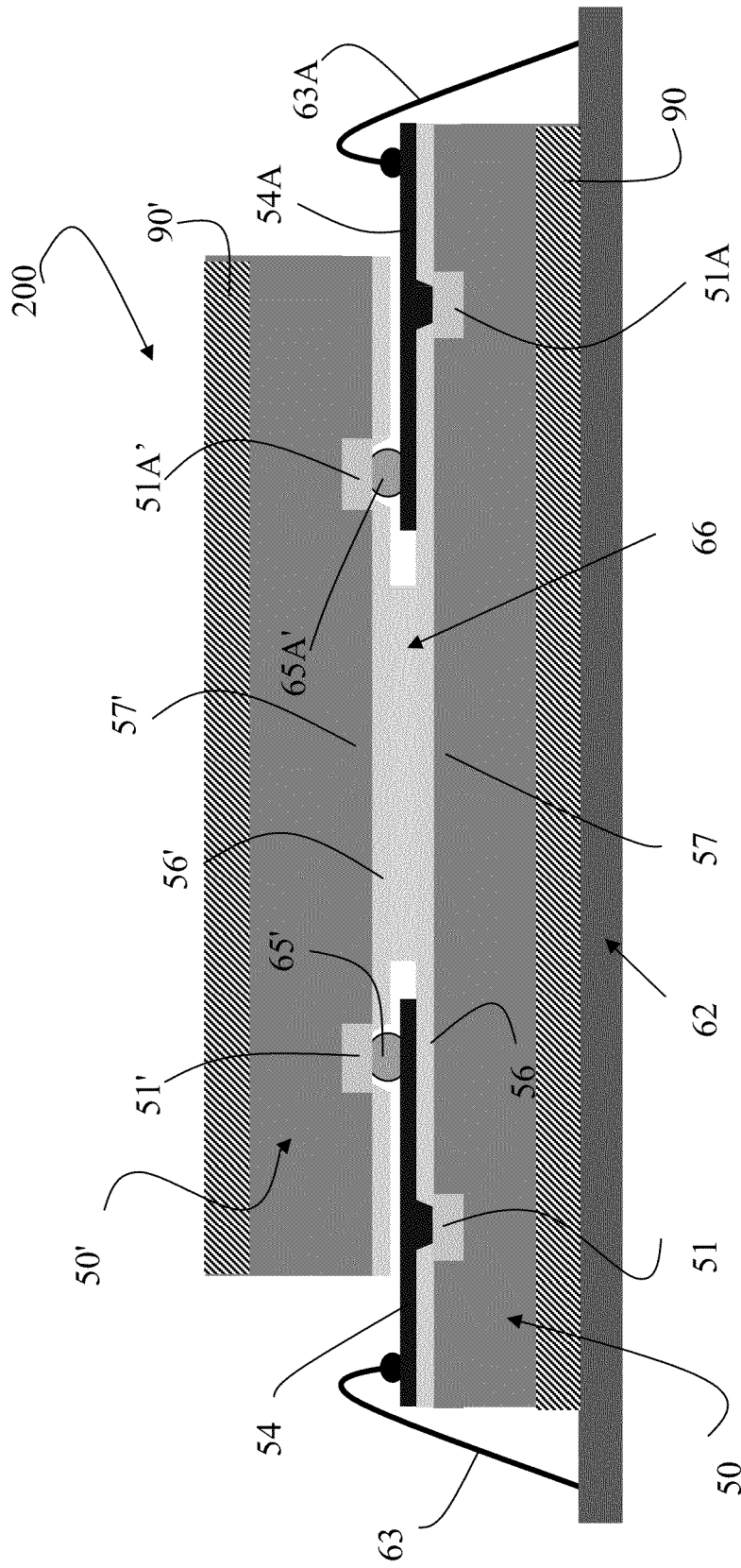

According to an embodiment according to the disclosure, two face-to-face chips can be assembled in a stacked pyramidal configuration, globally indicated with 200, by connecting the two devices through bumps and through the extended metallization layers that can be present on a device or on both the devices. FIG. 27 shows a first and a second device 50 and 50' according to this configuration. The first device 50 comprises two pads 51 and 51A and is positioned on the support element 62 of the package. Two extended metallization layers 54 and 54A are positioned above the passivation layer 56 in correspondence respectively with the pads 51 and 51A. An insulating layer 66 separates the first chip 50 form the second chip 50', which comprises in turn two pads 51' and 51A'. Two bumps 65' and 65A' positioned in correspondence with the pads 51' and 51A' connect the second device 50' respectively with the extended metallization layers 54' and 54A' of the first device 50. On the extended metallization layers wire bonds 63 and 63A can be created which connect the first device 50 to the support element 62 of the package.

Advantageously, in this way the insertion of a dummy chip with a "redistribution layer" between the two devices can be avoided, thus reducing the thickness of the "stack" and its complexity, and reducing the length of the paths of the connections between the two devices, which can be useful for high frequency signals.

Advantageously, between two devices a gluing and electrically insulating material 66 can also be inserted by using one of the several known techniques.

Figure 28:
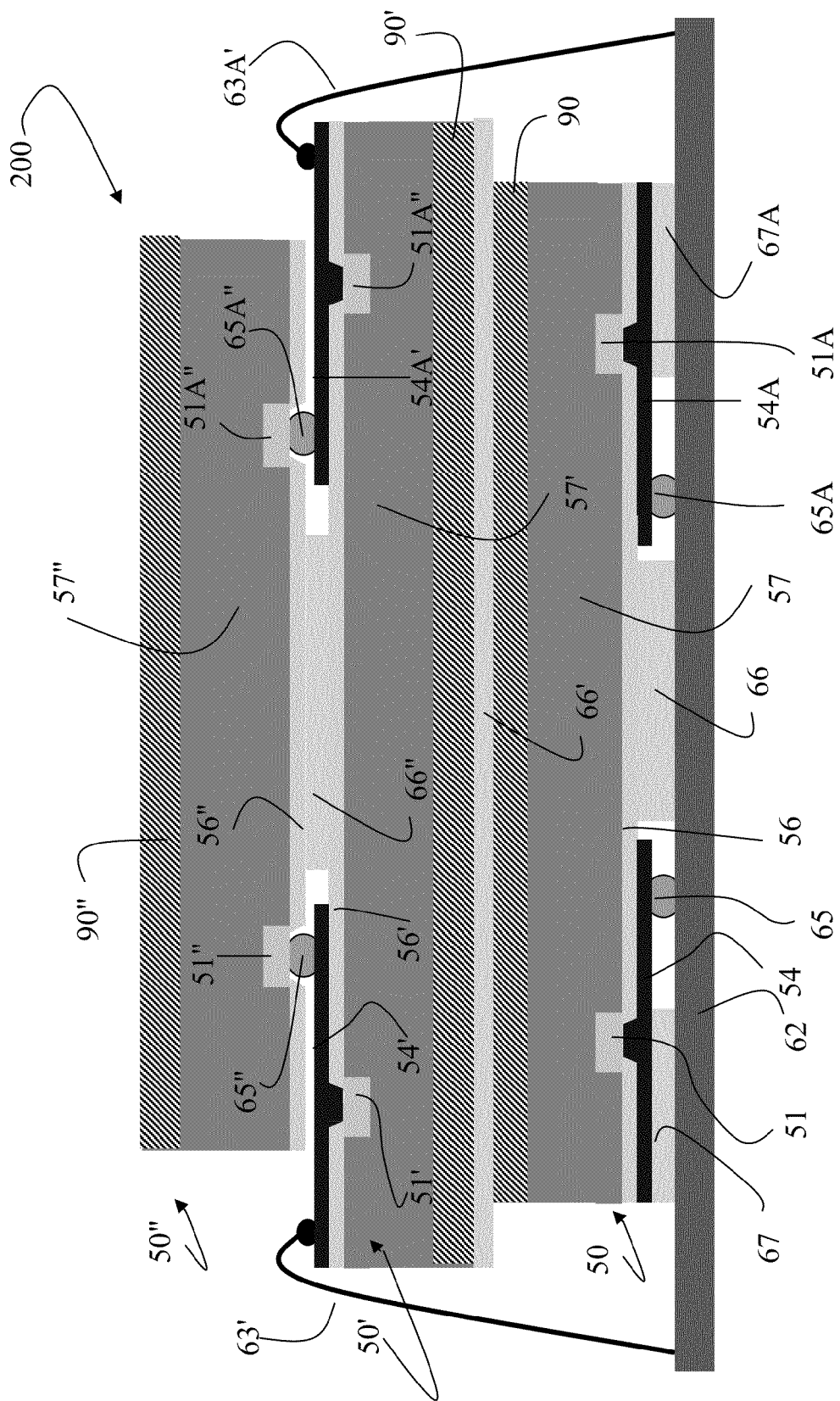

According to one embodiment of the method according to the disclosure, also complex structures can be used of chips stacked onto one another, in stacked configuration 200. For example, FIG. 28 shows a first, a second and a third device 50, 50' and 50" stacked on the support element 62 of the package in a stacked configuration 200. The first device 50 is leaned, from the front, on the support element 62 of the package wherefrom is separated through a first insulating layer 66, while a second and a third insulating layer 67 and 67A are respectively realized above one first and one second extended metallization layer 54, 54A. The first device 50 is also connected to the support element 62 of the package through a first and a second bump 65 and 65A placed respectively in contact with the first and second extended metallization layers 54, 54'. On the first device 50 a second device 50' is stacked separated from the first device 50 by an insulating layer 66'. This second device 50' comprises a first pad 51' and a second pad 51A' in whose correspondence a first and a second extended metallization layer 54', 54A' are respectively formed, which are in turn connected to the support element 62 of the package through a first wire bond 63' and a second wire bond 63A'. Moreover, an insulating layer 66" serves as separator between the second device 50' and a third device 50" stacked on it, comprising in turn a first pad 51" and a second pad 51A" in face of the second chip 50' and connected to it, in particular to the extended metallization layers 54' and 54A', respectively through a first bump 65" and a second bump 65A".

Figure 29:
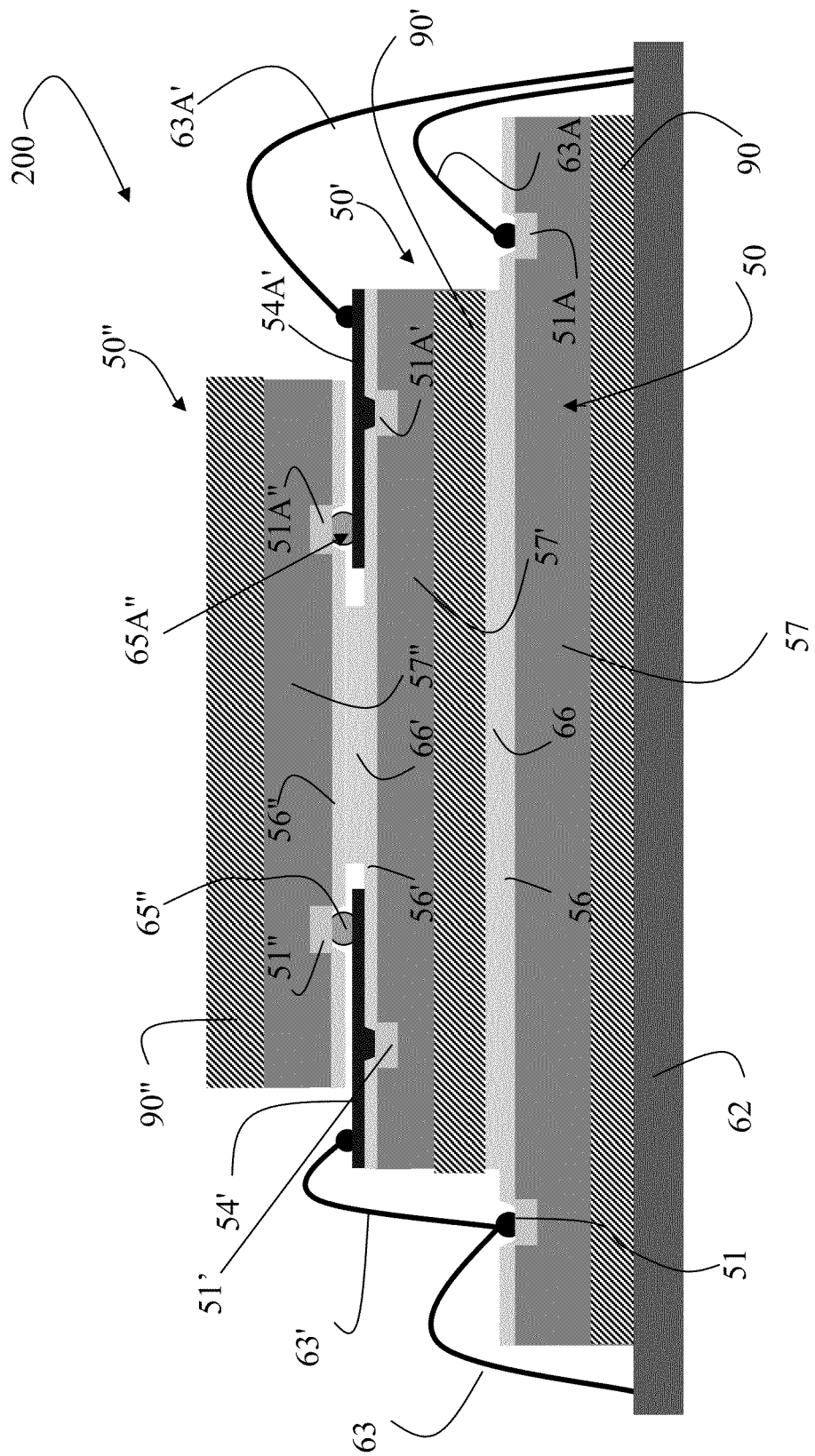

According to another embodiment, shown in FIG. 29, in a "pyramidal stacked" structure always indicated with 200, extended metallization layers are not present on the first device 50, connected to the support element 62 of the package through a first wire bond 63 and a second wire bond 63A. On the first device 50 an insulating layer 66 is instead made, whereon a second device 50' is placed comprising a first pad 51' and a second pad 51A' in whose correspondence a first extended metallization layer 54' and a second extended metallization layer 54A' are formed, which are respectively connected to the first device 50 through a first wire bond 63' and to the support element 62 of the package through a second wire bond 63A'.

Figure 30A:
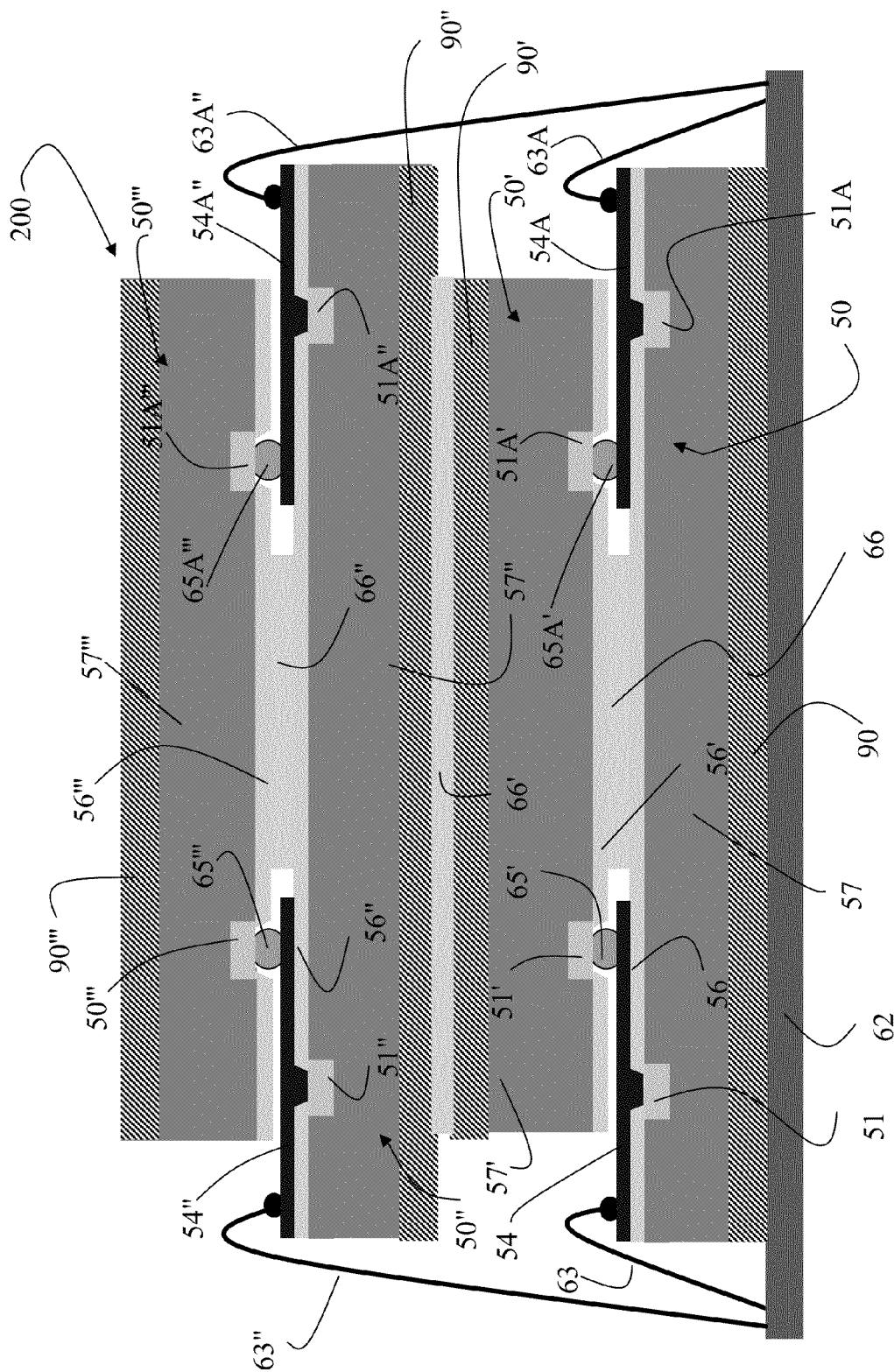
Figure 30B:
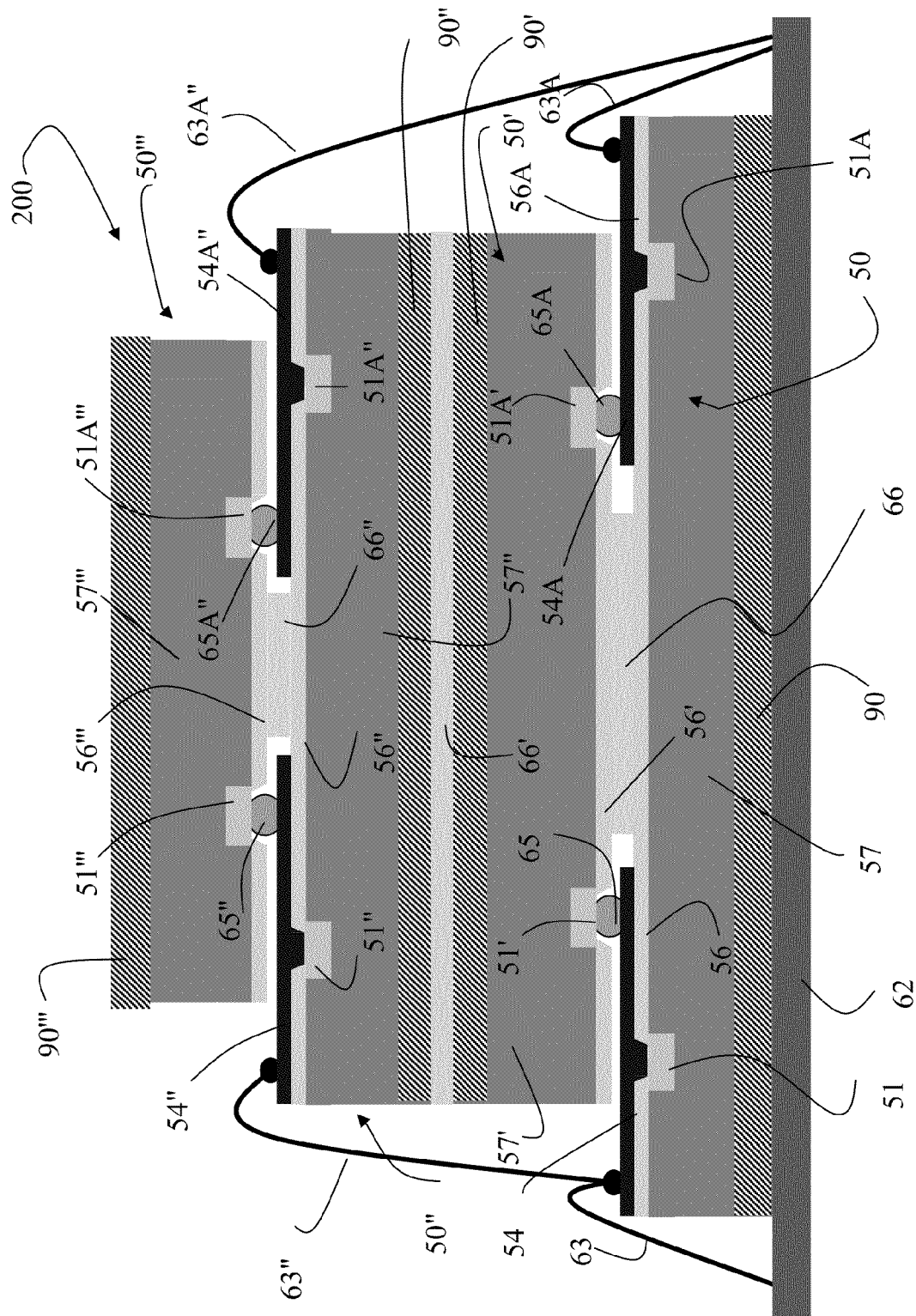
Figure 31:
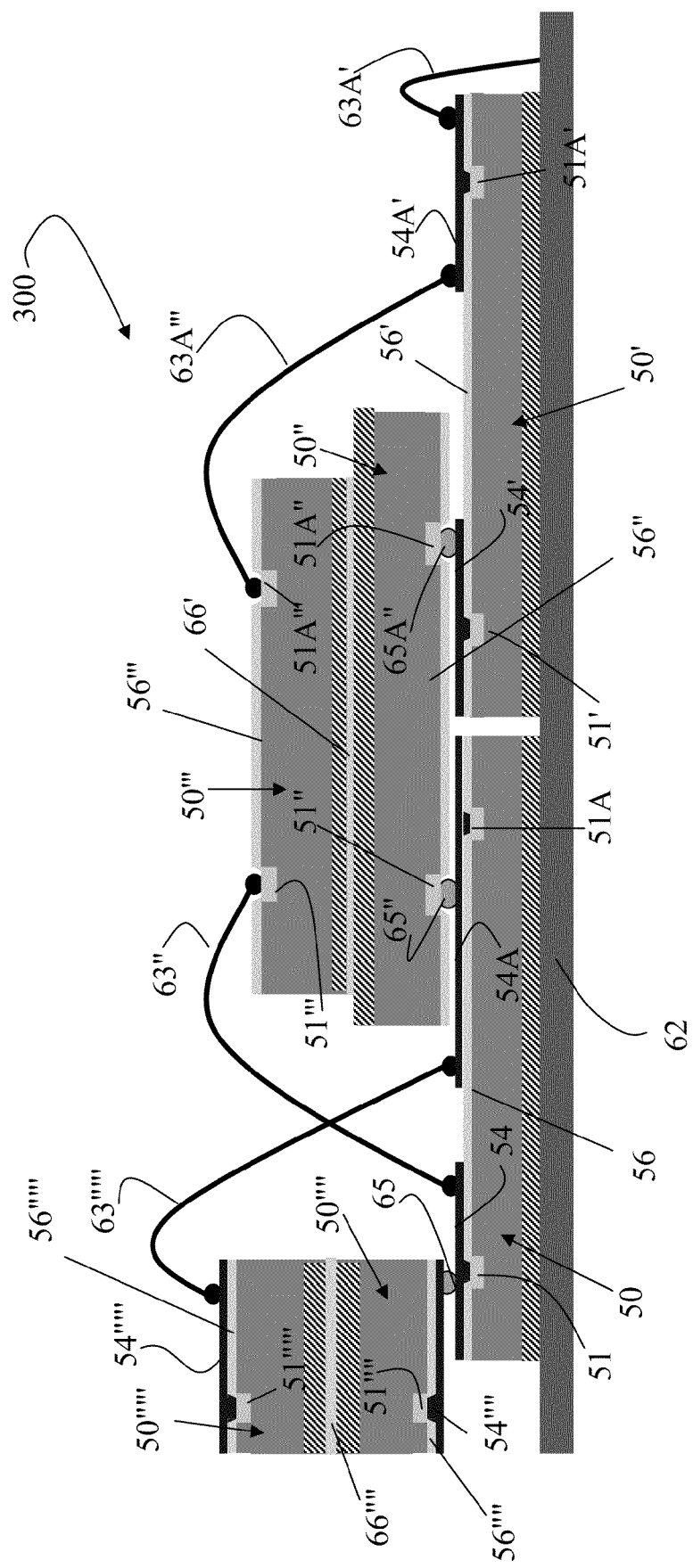

Alternative embodiments of the method according to the disclosure suitable for realizing configurations 200 of the "stacked" type are shown in FIGS. 30A, 30B and 31. FIGS. 30A and 30B, for example, show structures of the "stacked" type wherein four devices 50, 50', 50" and 50''' are stacked by using a combination of the methods according to the disclosure and as previously described.

FIG. 31 shows a non-limiting example of a structure 300 used for creating a "System in Package" (SiP) which uses the method according to the disclosure. In particular, a support element 62 is shown of a package whereon a first device 50 comprising a first pad 51, a second pad 51A, a first extended metallization layer 54 and a second extended metallization layer 54A, as well as a second device 50', flanked to the first, comprising a first pad 51', a second pad 51A', a first extended metallization layer 54' and a second extended metallization layer 54A' connected to the support element 62 of the package through a wire bond 63A' are placed. A third device 50", comprising a first pad 51" and a second pad 51A", is partially positioned, for example in half, above the first device 50 and connected to this through a first bump 65" positioned on the second extended metallization layer 54A, and is partially positioned, for example in half, above the second device 50' and connected to this through a second bump 65A" positioned on the first extended metallization layer 54'. A fourth device 50''', comprising a first pad 51''' and a second pad 51A''', is positioned, in a pyramidal configuration, above the third device 50" and connected to the first extended metallization layer 54 through a wire bond 63''' and to the second extended metallization layer 54A' through a wire bond 63A'''. Moreover, a fifth device 50'''', comprising a pad 51'''' and an extended metallization layer 54'''', and a sixth device 50''''', comprising a pad 51''''' and an extended metallization layer 54''''', are partially positioned on the first device 50. In particular, the fifth device 50'''' is connected to the first extended metallization layer 54 through a bump 65 and the sixth device 50''''' is connected to the second extended metallization layer 54A through a wire bond 63'''''.

Advantageously, in the structures placed in a SiP some chips can have extended metallization layers and others can be devoid thereof, according to the packaging used to create the final product.

Advantageously, more wire bonds and/or more bumps can be present for each extended metallization layer, which can follow a path, also very articulated, and connect two or more chips to each other or connect more terminals of a same chip to each other or also more terminals of different chips.

The method according to the disclosure can be applied also to a device comprising conductive paths which cross the substrate of the device (through silicon vias—TSV), like the device 50 shown in FIGS. 32A and 32B, comprising at least one TSV 80 filled in with a metallic material 81, which, starting from the pad 51 in contact with the extended metallization layer 54, vertically crosses at least part of the device 50 and in particular the substrate 90 of the device 50.

As shown in FIG. 32B, the TSV 80 is usually coated with an insulating material 82, for example an oxide, so as to reduce the parasite effects due for example to the losses with the substrate 90. It is possible to use a same metallic material for simultaneously realizing the metallic part 81 of the TSV 80, the pad 51 and the extended metallization layer 54 through a suitable process, which comprises at least one deposition step.

Figure 33A:
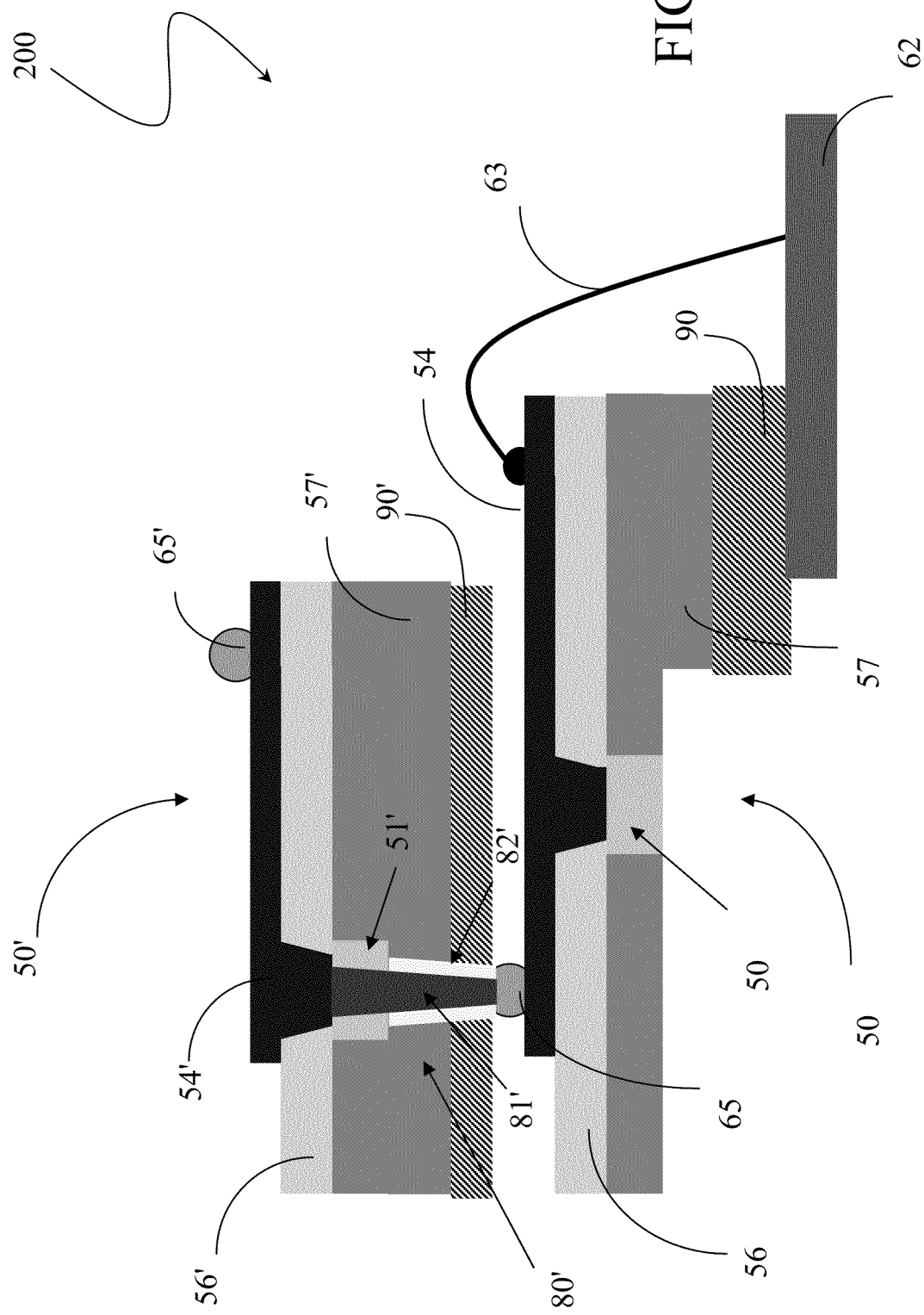
FIGS. 33A-33B show, in section, a first and a second embodiment of stacks of devices, according to the fourth embodiment of the method according to the disclosure.
Figure 33B:
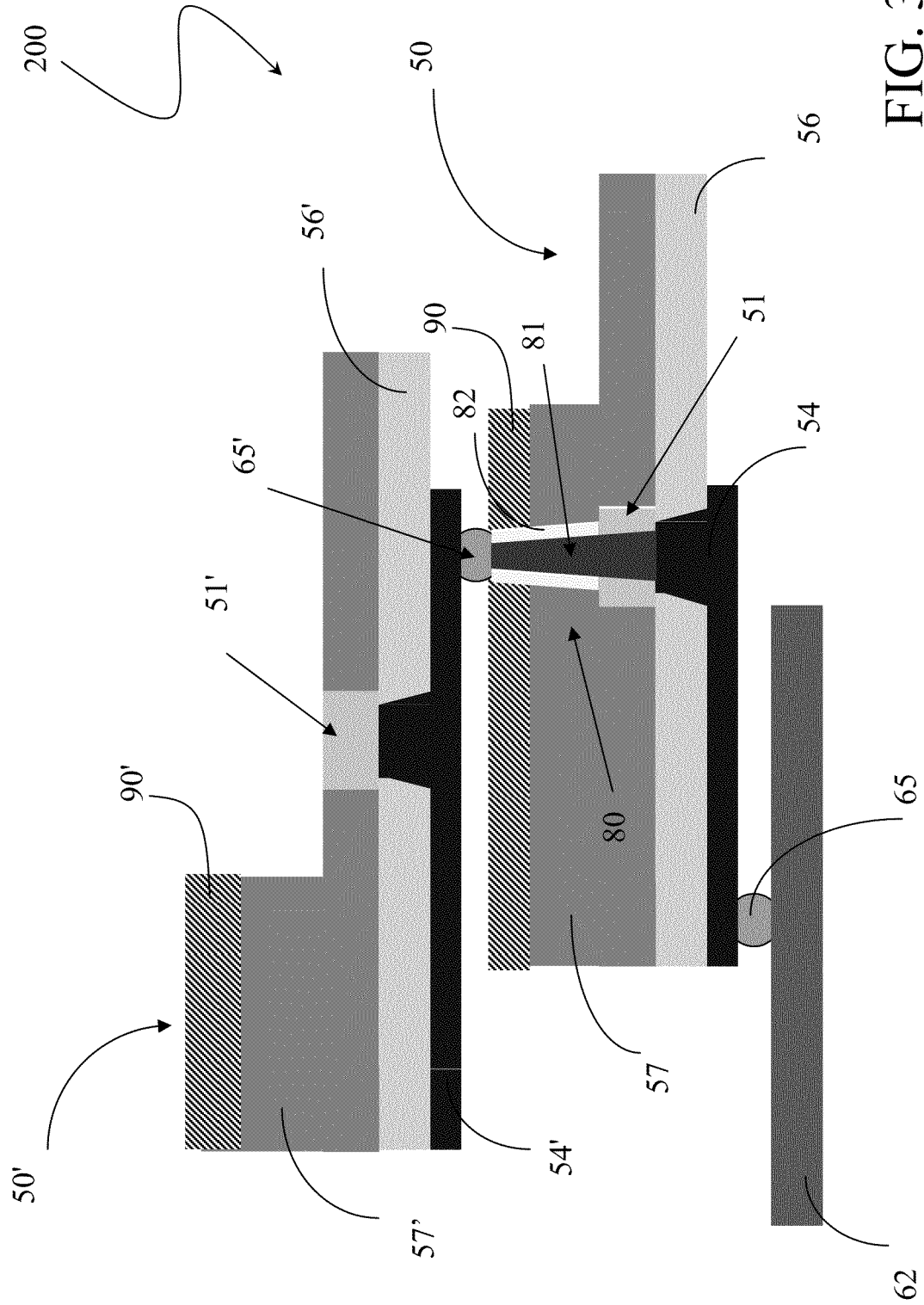

Advantageously the extended metallization layer 54 can be used for connecting a device 50 to a device 50' through the TSV 80, as shown for example in FIGS. 33A and 33B. Advantageously according to the disclosure, in this way it is possible to simplify the design and realization of the devices and of the final system comprising them.

In particular, FIG. 33A shows a first and a second device, 50 and 50', connected to each other by means of a bump 65 and a TSV 80'. In particular, the bump 65 is realized so as to contact the extended metallization layer 54 of the first device 50 and the metallic material 81' which realizes the TSV 80' of the second device 50'. A wire bond 63 also connects the first device 50 to the support element 62 of the package and thus to the remaining circuit, not shown in the figure.

FIG. 33B shows a first device 50 and a second device 50' in flip-chip configuration with respect to the first, connected to each other by means of a second bump 65' belonging to the second device 50', realized so as to contact the extended metallization layer 54' of the second device 50' and the metallic material 81 which realizes the TSV 80 of the first device 50. A first bump 65 further connects the extended metallization layer 54 of the first device 50 to the support element 62 of the package and then with the remaining circuit, not shown in the figure.

The TSV are structures that can have a diameter also very small, for example 5-10 μm, which makes them, in practice, very difficult to be contacted through a probe 59.

Advantageously according to the disclosure, it is possible to realise extended metallization layers of much greater size and lower electric resistance with respect to a TSV 80, and use them for the probing; in this way the contact surface with the probes is increased with respect to a standard TSV 80.

Figure 34:
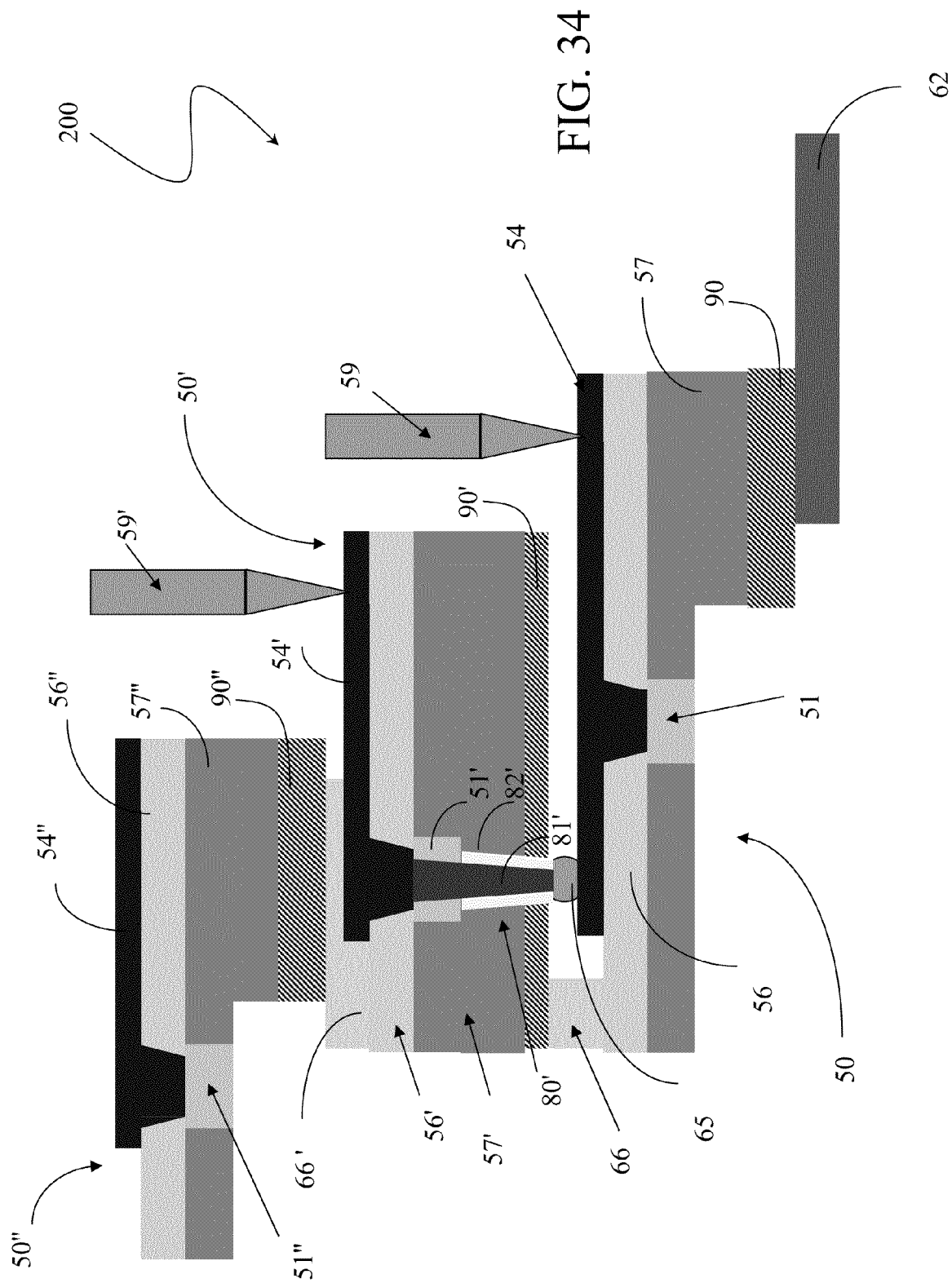
FIG. 34 shows, in section, a third embodiment of a stack of devices, according to the fourth embodiment of the method according to the disclosure.

According to an embodiment of the method according to the disclosure, also complex structures can be realized of chips stacked onto each other, in stacked configuration 200, connected to each other through TSV and extended metallization layers. For example, FIG. 34 shows a first, a second and a third device 50, 50' and 50" stacked on the support element 62 of the package in a stacked configuration 200. The first device 50 is leaned with its substrate 90 on the support element of the package and is connected to the second device 50' through a first bump 65 which connects the extended metallization layer 54 to the TSV 80' realized in the second device 50'.

A first insulating layer 66 separates the first device 50 from the second device 50', while a second insulating layer 66' is realised above the extended metallization layer 54' of the second device 50' and separates it from the substrate 90" of a third device 50" realized above the second device 50'.

Two probes 59 and 59' are positioned on the portions of the extended metallization layers 54 and 54' of the first and of the second device, 50 and 50'.

Advantageously, then, the presence of the extended metallization layers also allows the testing of at least part of the stacked structure 200, through the probes 59 and 59' connected to a tester; for example, by making a current flow from the probe 59 to the probe 59' the correct operation of the TSV 80' and of at least part of the stacked structure 200 can be verified, during its assembly and packaging steps.

It is to be underlined that, to meet specific application requirements, it is obviously possible to combine one or more of the embodiments of the method and of the device according to the disclosure above described and shown in the figures.

In conclusion, the method according to the disclosure allows to make it strong the electrical testing process EWS, or WLBI etc. by performing the probing in non-active areas, in particular the scribe lines outside the device. In this way, the pads of the single device and of its close devices on the wafer are not damaged by the probing, i.e., by the use of the probes for performing the electrical testing.

Moreover, the method according to the disclosure makes the assembly process of one or more devices inside a package stronger and more reliable, both in case of assembly of the "stacked" type, and in case of a SiP. Thanks to the disclosure, the problems of poor adhesion between a pad and a wire bond due to the damaging the pad undergoes during a traditional probing, in particular due to the contact with the test probes, and those of breakages of layers underlying the contact region or "Probe Region", which occur with the use of the POP technique, are in fact eliminated.

A further advantage consists in that, by using extended metallization layers, it is possible to connect two stacked devices creating shorter wire bonds closer to the perimeter of a die or chip, with respect to the case in which the bonding is performed directly on a pad, therefore a second die stacked above the first can have greater size. Moreover, the reduced length of the wire bond allows to reduce the parasitic effects of the wire bond itself on the signals.

By using the extended metallization layers it is also possible to create more wire bonds for a same pad, by connecting the various wire bonds to the extended metallization layer. This solution ensures high qualitative levels, which, for example, are requested in the "automotive" applications.

Moreover, the described method reduces the thickness of the package wherein the devices are assembled, since it allows to avoid the use of dummy chips with a redistribution layer. This method allows, also, to create the electric connections between a chip and the chips stacked thereon through extended metallization layers and not through metallization layers on the back of the chip. In this way, the assembly process is simplified and has a reduced cost.

The method according to the disclosure allows, moreover, to realize more than one bump for each single connection between chip and chip or between a chip and the rest of the circuit, reducing the problems caused by faulty bumps. Moreover, the electric connection through bump has a reduced resistance and is, then, crossed by a greater current intensity.

A further advantageous of the described method consists in the possibility to realize more wire bonds and/or more bumps for each extended metallization layer, saving number of pads whereon wire bonds and bumps are to be created and thus area of the chip.

Moreover, the extended metallization layers can also have a very articulated path and connect two or more chips to each other or connect more terminals of a same chip to each other or also more terminals of different chips. It is possible, thus, to create shorter connections between two or more chips connected to each other through bump, which is advantageous mainly for high frequency signals.

The use of extended metallization layers also avoid problems due to the damaging of the bump due to the probing.

Naturally, a technician of the field will be enabled to apply several modifications to the previously described solution. Although the present disclosure has been described with reference to its preferred embodiments, it should be clear that various omissions, substitutions and modifications in the form and in the details, such as other embodiments are possible; it is also expressly intended that specific elements and/or steps of the method described in relation to any embodiment of the described disclosure can be incorporated in any other embodiment as general aspects of design choices.

For example the extended metallization layer can be realized with more layers of different metals.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
performing electrical wafer testing and assembly of a first electronic device on a wafer, the first electronic device including an insulating layer on the wafer, a passivation layer covering the insulating layer, and a first pad made in the insulating layer, the performing including:
realizing a non-active area if said wafer with a lowered surface with respect to a surface of said first electronic device;
providing said first electronic device with an extended metallization layer extending on said passivation layer from said first pad to the non-active area of said wafer;
connecting said first electronic device to a testing apparatus;
performing the electrical wafer testing of said first electronic device by positioning a probe of said testing apparatus on a portion of said extended metallization layer positioned on said non-active area;
cutting said wafer after performing the electrical wafer testing of said first electronic device, the cutting including reducing an extension of said metallization layer to an edge of said first electronic device; and
forming on said extended metallization layer an electrical connection after cutting said wafer.

2. The method according to claim 1, further comprising forming an electrically insulating filling layer in the non-active area, the electrically insulating filling layer being positioned between the insulating layer and the extended metallization layer.

3. The method according to claim 1, wherein the realizing includes realizing the surface of said non-active area to be level with respect to a surface of said passivation layer.

4. The method according to claim 1, wherein the non-active area includes a scribe line area of the wafer.

5. The method according to claim 1, further comprising forming a second device on the wafer, the second device including a second pad, wherein said extended metallization layer extends from said first pad to the second pad and on said non-active area of said wafer.

6. The method according to claim 1, further comprising forming a blind via extending from said extended metallization layer at one of the following positions:
at an edge of said first electronic device adjacent to said non-active area;
inside an active area of said first electronic device; and
in said non-active area.

7. The method according to claim 1, wherein said electrical connection is positioned on a portion of said metallization layer extended to the edge.

8. A method, comprising:
performing electrical wafer testing and assembly of a first electronic device on a wafer, the first electronic device including an insulating layer on the wafer, a passivation layer covering the insulating layer, and a first pad made in the insulating layer, the performing including:
providing said first electronic device with an extended metallization layer extending said passivation layer from said first pad to the non-active area of said wafer;
connecting said first electronic device to a testing apparatus;
performing the electrical wafer testing of said first electronic device by positioning a probe of said testing apparatus on a portion of said extended metallization layer positioned on said non-active area;
cutting said wafer after performing the electrical wafer testing of said first electronic device, the cutting including reducing an extension of said metallization layer to an edge of said first electronic device;
forming on said extended metallization layer an electrical connection after cutting said wafer; and
forming a through-silicon via in said first electronic device, and in contact with said extended metallization layer, forming the through-silicon via including depositing a layer of metallic material that extends from said first pad vertically through at least part of said first electronic device, wherein said extended metallization layer is formed simultaneously with forming the layer of metallic material.

9. The method according to claim 8, further comprising forming an electrically insulating filling layer in the non-active area, the electrically insulating filling layer being positioned between the insulating layer and the extended metallization layer.

10. A method to perform electrical testing and assembly of a first electronic device comprised in a wafer and including a first pad in an active area of the first electronic device, said pad being surrounded by a dielectric layer which is covered by a passivation layer, the method comprising:
forming a non-active area of the wafer with a lowered surface with respect to a surface of said first electronic device;
electrically coupling said electronic device to a testing apparatus;
providing said first electronic device with an extended metallization layer extending on said passivation layer from said first pad to the non-active area of said wafer, said non-active area being free of pads;
performing the electrical testing of said electronic device, the performing including positioning a probe of said testing apparatus on a portion of said extended metallization layer on said non-active area, no pads having been realized on said non-active region under said portion;
cutting said wafer, the cutting including reducing an extension of said extended metallization layer to an edge of said first electronic device; and
embedding said first electronic device inside a package and forming on said extended metallization layer an electric connection configured to be connected to a circuit in said package.

11. The method according to claim 10, wherein said non-active area comprises an electrically insulating filling layer.

12. The method according to claim 10, wherein the surface of the non-active area is leveled to a surface of said passivation layer.

13. The method according to claim 10, wherein the non-active area includes a scribe line area of the wafer.

14. The method according to claim 10, wherein said extended metallization layer extends from said first pad to a second pad of a second electronic device of said wafer through said non-active area of said wafer.

15. The method according to claim 10, comprising forming a blind via extending from said extended metallization layer at one of the following positions:
   at an edge of said first electronic device adjacent to said non-active area;
   inside the active area of said first electronic device;
   in said non-active area.

16. The method according to claim 10, wherein said electric connection is positioned on a portion of said extended metallization layer which is extended to the edge.

17. A method to perform electrical testing and assembly of a first electronic device comprised in a wafer and including a first pad in an active area of the first electronic device, said pad being surrounded by dielectric layer which is covered by a passivation layer, the method comprising:
   forming a non-active area of the wafer with a lowered surface with respect to a surface of said first electronic device;
   electrically coupling said electronic device to a testing apparatus;
   providing said first electronic device with an extended metallization layer extending on said passivation layer from said first pad to the non-active area of said wafer, said non-active area being free of pads;
   performing the electrical testing of said electronic device, the performing including positioning a probe of said testing apparatus on a portion of said extended metallization layer on said non-active area, no pads having been realized on said non-active region under said portion;
   cutting said wafer, the cutting including reducing an extension of said extended metallization layer to an edge of said first electronic device;
   embedding said first electronic device inside a package and forming on said extended metallization layer an electric connection configured to be connected to a circuit in said package; and
   forming a through-silicon via in said first electronic device, and in contact with said extended metallization layer, forming the through-silicon via including depositing a layer of metallic material that extends from said first pad vertically through at least part of said first electronic device, wherein said extended metallization layer is formed simultaneously with forming the layer of metallic material.

18. The method according to claim 17, further comprising forming an electrically insulating filling layer in the non-active area, the electrically insulating filling layer being positioned between the insulating layer and the extended metallization layer.

* * * * *